US012635465B2

(12) United States Patent
Nagayama et al.

(10) Patent No.: US 12,635,465 B2
(45) Date of Patent: May 19, 2026

(54) SUBSTRATE SUPPORT AND SUBSTRATE PROCESSING DEVICE

(71) Applicant: Tokyo Electron Limited, Tokyo (JP)

(72) Inventors: Akira Nagayama, Miyagi (JP); Atsushi Kawabata, Miyagi (JP); Masato Takayama, Miyagi (JP); Koji Kawanishi, Miyagi (JP); Takeshi Akao, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 161 days.

(21) Appl. No.: 18/424,223

(22) Filed: Jan. 26, 2024

(65) Prior Publication Data

US 2024/0162075 A1 May 16, 2024

Related U.S. Application Data

(63) Continuation of application No. PCT/JP2022/027680, filed on Jul. 14, 2022.
(Continued)

(30) Foreign Application Priority Data

Feb. 10, 2022 (JP) ................................. 2022-019880

(51) Int. Cl.
*H01L 21/683* (2006.01)
*H01J 37/32* (2006.01)

(52) U.S. Cl.
CPC .... *H01L 21/6833* (2013.01); *H01J 37/32577* (2013.01); *H01J 37/32642* (2013.01); *H01J 37/32724* (2013.01); *H01J 37/32091* (2013.01)

(58) Field of Classification Search
CPC ........... H01L 21/6833; H01L 21/67103; H01L 21/6831; H01L 21/68735; H01L 21/6875;
(Continued)

(56) References Cited

U.S. PATENT DOCUMENTS 5,781,400 A * 7/1998 Takahashi ........... H01L 21/6833
361/233
6,108,189 A * 8/2000 Weldon ............... C23C 16/4586
279/128
(Continued)

FOREIGN PATENT DOCUMENTS

JP 2018-110216 A 7/2018
JP 2021-044540 A 3/2021
(Continued)

OTHER PUBLICATIONS

International Search Report mailed on Sep. 13, 2022, received for PCT Application PCT/JP2022/027680, filed on Jul. 14, 2022, 5 pages including English Translation.

*Primary Examiner* — Thienvu V Tran
*Assistant Examiner* — Muaamar Qahtan Al-Taweel
(74) *Attorney, Agent, or Firm* — XSENSUS LLP

(57) ABSTRACT

The present disclosure provides a substrate support. The substrate support comprises: a base; a first dielectric portion, disposed on the base, having a substrate support portion on which a substrate is mounted; and a second dielectric portion, disposed around the first dielectric portion, having an edge ring support portion on which an edge ring is mounted, wherein at least one of the first dielectric portion and the second dielectric portion includes a sprayed layer formed of an insulating material.

24 Claims, 10 Drawing Sheets

Related U.S. Application Data

(60) Provisional application No. 63/226,662, filed on Jul. 28, 2021.

(58) Field of Classification Search
CPC ............. H01L 21/68757; H01L 21/683; H01L 21/68785; H01J 37/32577; H01J 37/32642; H01J 37/32724; H01J 37/32091; H01J 37/32568; H01J 37/32715; H02N 13/00; H05H 1/46
See application file for complete search history.

(56) References Cited

U.S. PATENT DOCUMENTS

| | | | |
|---|---|---|---|
| 6,310,755 B1 * | 10/2001 | Kholodenko | C04B 35/565 |
| | | | 361/115 |
| 6,370,007 B2 * | 4/2002 | Takahasi | H01L 21/6833 |
| | | | 361/234 |
| 10,475,687 B2 * | 11/2019 | Kosakai | H02N 13/00 |
| 2015/0206722 A1 | 7/2015 | Yamamoto | |
| 2016/0079107 A1 | 3/2016 | Aramaki et al. | |
| 2018/0190501 A1 | 7/2018 | Ueda | |
| 2020/0126837 A1 * | 4/2020 | Kuno | B23Q 3/15 |
| 2021/0074524 A1 * | 3/2021 | Koshimizu | H01J 37/32642 |
| 2021/0308812 A1 * | 10/2021 | Maeda | H01L 21/3065 |

FOREIGN PATENT DOCUMENTS

| | | |
|---|---|---|
| KR | 10-20110014104 A | 2/2011 |
| KR | 10-20170001603 A | 1/2017 |
| KR | 10-20180122964 A | 11/2018 |

* cited by examiner

SUBSTRATE SUPPORT AND SUBSTRATE PROCESSING DEVICE

CROSS-REFERENCE TO RELATED APPLICATIONS

This application is a bypass continuation application of International Application No. PCT/JP2022/027680 having an international filing date of Jul. 14, 2022 and designating the United States, the International Application being based upon and claiming the benefit of priority from U.S. Patent Application No. 63/226,662, filed on Jul. 28, 2021 and Japanese Patent Application No. 2022-019880, filed on Feb. 10, 2022, the entire contents of which are incorporated herein by reference.

TECHNICAL FIELD

The present disclosure relates to a substrate support and a substrate processing apparatus.

BACKGROUND

Japanese Laid-open Patent Publication No. 2021-44540 discloses an electrostatic chuck for holding a substrate. The electrostatic chuck has a dielectric portion, and an electrode for generating electrostatic attraction is installed inside the dielectric portion.

SUMMARY

The present disclosure reduces manufacturing cost, while shortening a manufacturing period of a substrate support.

One aspect of the present disclosure provides a substrate support. The substrate support comprises: a base; a first dielectric portion, disposed on the base, having a substrate support portion on which a substrate is mounted; and a second dielectric portion, disposed around the first dielectric portion, having an edge ring support portion on which an edge ring is mounted, wherein at least one of the first dielectric portion and the second dielectric portion includes a sprayed layer formed of an insulating material.

DETAILED DESCRIPTION

Figure 1:
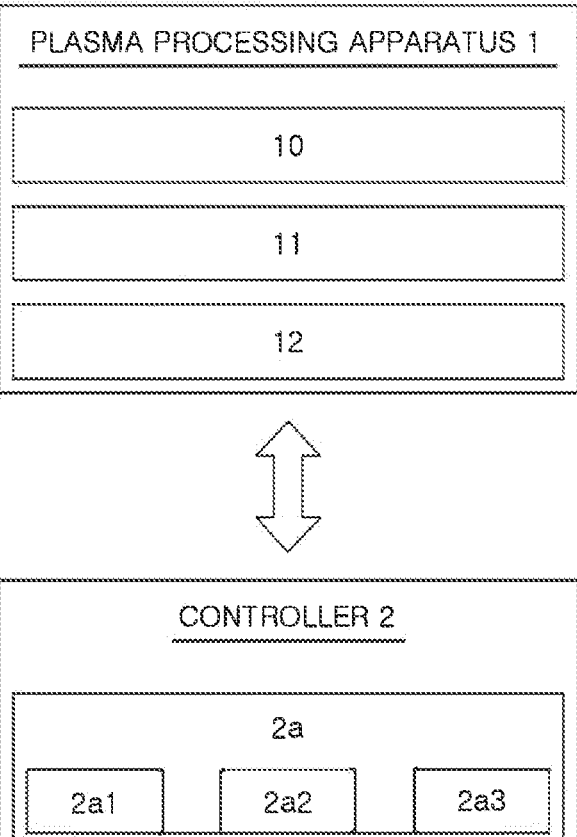
FIG. 1 is a diagram illustrating a configuration example of a plasma processing system.

In a semiconductor device manufacturing process, for example, plasma processing is performed on a semiconductor substrate (hereinafter referred to as a "substrate") in a plasma processing apparatus. In the plasma processing apparatus, plasma is generated by exciting a processing gas inside a chamber, and a substrate supported on an electrostatic chuck is processed by the plasma.

The electrostatic chuck, as disclosed in Japanese Laid-open Patent Publication No. 2021-44540, for example, has a dielectric portion including an electrode for generating electrostatic attraction therein. The dielectric portion is configured by, for example, a sintered plate in the related art. However, if the dielectric portion is manufactured with a sintered plate, a manufacturing period is long and manufacturing cost is high.

Therefore, the technology related to the present disclosure shortens the manufacturing period of a substrate support and reduces the manufacturing cost. Hereinafter, a substrate processing apparatus and a substrate support according to the present embodiment are described with reference to the drawings. In addition, in this specification and drawings, elements having substantially the same functional configuration are given the same reference numerals to avoid redundant description.

<Plasma Processing System>

First, a plasma processing system according to an embodiment is described with reference to FIG. 1. FIG. 1 is a diagram illustrating a configuration example of a plasma processing system.

In an embodiment, the plasma processing system includes a plasma processing apparatus 1 and a controller 2. The plasma processing system is an example of a substrate processing system, and the plasma processing apparatus 1 is an example of a substrate processing apparatus. The plasma processing apparatus 1 includes a plasma processing chamber 10, a substrate support portion 11, and a plasma generator 12. The plasma processing chamber 10 has a plasma processing space. In addition, the plasma processing chamber 10 has at least one gas supply port for supplying at least one processing gas to the plasma processing space and at least one gas discharge port for discharging the gas from the plasma processing space. The gas supply port is connected to a gas supplier 20, which is described below, and the gas discharge port is connected to an exhaust system 40, which is described below. The substrate support portion 11 is disposed within the plasma processing space and has a substrate support surface for supporting the substrate.

The plasma generator 12 is configured to generate plasma from at least one processing gas supplied into the plasma processing space. The plasma formed in the plasma processing space may be capacitively coupled plasma (CCP), inductively coupled plasma (ICP), electron-cyclotron-resonance (ECR) plasma, helicon wave plasma (HWP), surface wave plasma (SWP), etc. In addition, various types of plasma generators including an alternating current (AC) plasma generator and a direct current (DC) plasma generator may be used. In an embodiment, an AC signal (AC power) used in the AC plasma generator has a frequency in the range of 100 kHz to 10 GHz. Accordingly, AC signals include radio frequency (RF) signals and microwave signals. In an embodiment, the RF signal has a frequency in the range of 100 kHz to 150 MHz.

The controller 2 processes computer-executable instructions that cause the plasma processing apparatus 1 to execute various processes described in the present disclosure. The controller 2 may be configured to control each element of the plasma processing apparatus 1 to execute various processes described herein. In an embodiment, a portion or the entirety of the controller 2 may be included in the plasma processing apparatus 1. The controller 2 may include a processor 2a1, a storage 2a2, and a communication interface 2a3. The controller 2 is realized by, for example, a computer 2a. The processor 2a1 may be configured to perform various control operations by reading a program from the storage 2a2 and executing the read program. This program may be stored in advance in the storage 2a2 or may be acquired through a medium when necessary. The acquired program is stored in the storage 2a2 and is read from the storage 2a2 by the processor 2a1 to be executed. The medium may be various storage mediums readable by the computer 2a or may be a communication line connected to the communication interface 2a3. The processor 2a1 may be a central processing unit (CPU). The storage 2a2 may include random access memory (RAM), read-only memory (ROM), hard disk drive (HDD), solid state drive (SSD), or combinations thereof. The communication interface 2a3 may communicate with the plasma processing apparatus 1 through a communication line, such as a local region network (LAN).

<Controller or Control Circuit>

Figure 2:
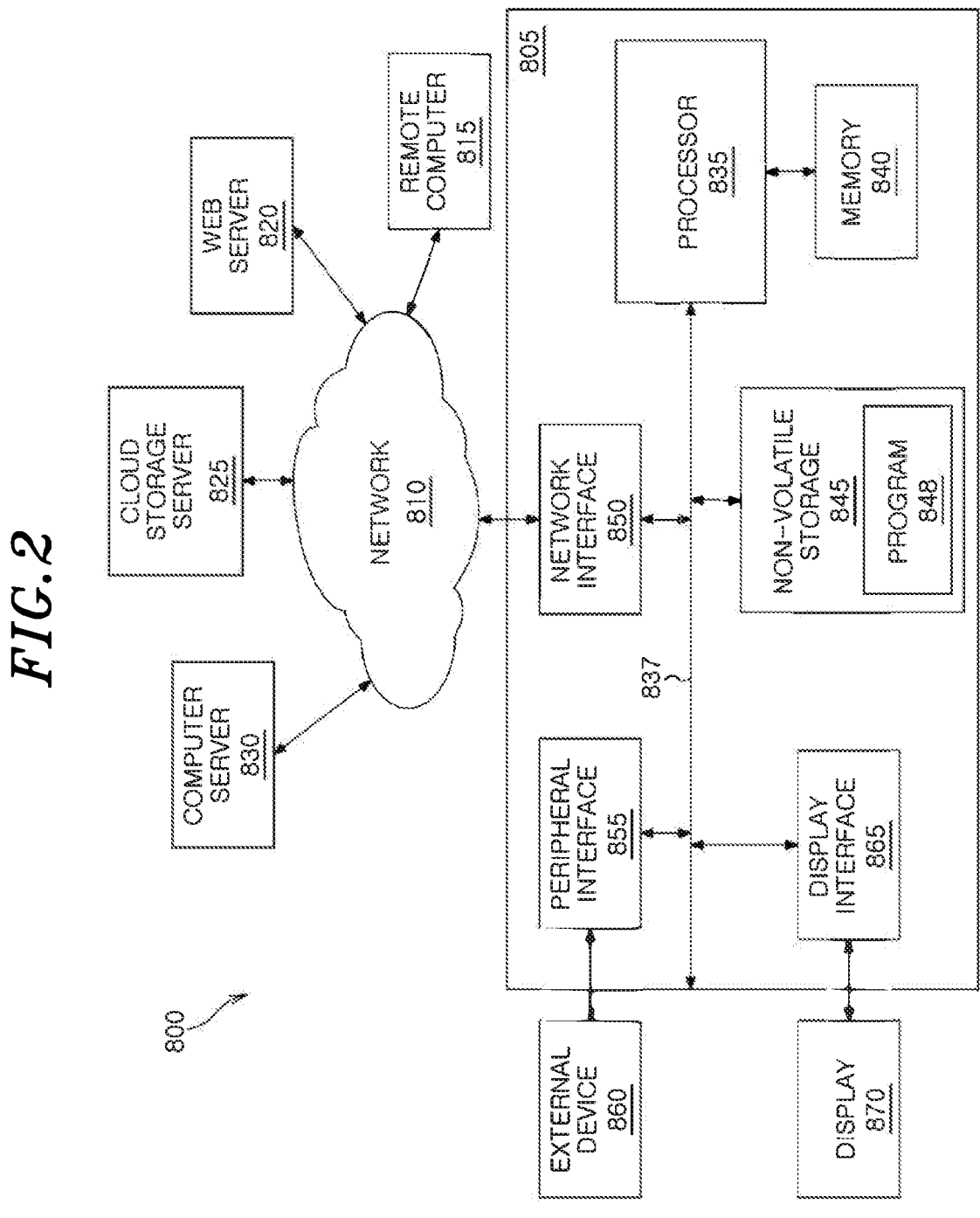
FIG. 2 is a block diagram of a computer capable of implementing various embodiments.

FIG. 2 is a block diagram of a controller or control circuit (e.g., computer) that may implement various embodiments described herein. The controller or control circuit in FIG. 2 corresponds to the controller 2. A control aspect of the present disclosure may be implemented as a system, a method, and/or a computer program product. The computer program product includes a computer-readable storage medium on which computer-readable program instructions are recorded, and one or more processors may execute the aspect of the embodiment. In addition, the controller in FIG. 2 may control processing performed by the plasma processing apparatus of the present disclosure.

The computer-readable storage medium may be a tangible device capable of storing instructions for use by an instruction execution device (processor). Examples of the computer-readable storage medium include, but are not limited to, electronic storage devices, magnetic storage devices, optical storage devices, electromagnetic storage devices, semiconductor storage devices, or any suitable combination of these devices. A non-exhaustive list of more specific examples of the computer-readable storage mediums (and suitable combinations) include each of the following: flexible disks, hard disks, solid state drives (SSDs), random access memory (RAM), read-only memory (ROM), programmable read-only memory (EPROM or flash), static random access memory (SRAM), compact disk (CS or CD-ROM), digital universal disk (DVD), memory card or stick. As used in the present disclosure, as for the computer-readable storage mediums, radio waves or other freely propagating electromagnetic waves, electromagnetic waves propagating through a waveguide or other transmission medium (e.g., optical pulses passing through a fiber optic cable), or electrical signals traveling through a wire should not be interpreted as a transient signal by itself.

The computer-readable program instructions described herein may be downloaded to a suitable computing device or processing device from a computer-readable storage medium or to an external computer or external storage device via a global network (i.e., the Internet), local region network, wide region network, and/or wireless network. The network may include copper wire, optical fiber, wireless transmission, routers, firewalls, switches, gateway computers, and edge servers. A network adapter card or network interface of each computing device or processing device may receive computer-readable program instructions from a network and transmit computer-readable program instructions for storage on a computer-readable storage medium within the computing device or processing device.

Computer-readable program instructions for performing the operations of the present disclosure may include machine language instructions and/or microcode and may be compiled or interpreted from source code written in any combination of one or more programming languages, including assembly language, Basic, Fortran, Java, Python, R, C, C++, C#, or similar programming languages. The computer-readable program instructions may be executed entirely on a user's personal computer, laptop, tablet, or smartphone or may be executed entirely on a remote computer or computer server, or any combination of these computing devices. The remote computer or computer server may be connected to the user's device or devices through a computer network including a local area network, a wide area network, or a global network (the Internet). In some embodiments, an electronic circuit may be configured or customized by executing computer-readable program instructions using information from computer-readable program instructions including, for example, a programmable logic circuit, a field programmable gate array (FPGA), or a programmable logic array (PLA) to perform the aspects of the present disclosure.

Aspects of the present disclosure are described with reference to flowcharts and block diagrams of methods, devices (systems), and computer program products according to embodiments of the disclosure. Those skilled in the art will understand that each block in the flowchart and block diagram and combinations of blocks in the flowchart and block diagram may be implemented by computer readable program instructions.

Computer-readable program instructions capable of implementing the systems and methods described in the present disclosure may be provided to one or more processors (and/or one or more cores within the processor) of a general-purpose computer, special-purpose computer, or other programmable device. These computer-readable program instructions may be stored on a computer-readable storage medium that may instruct a computer, programmable device, and/or other device to function in a particular manner, in which case the computer-readable storage medium storing the instructions is a product including instructions that implement aspects of the functionality specified in the flowcharts and block diagrams of the present disclosure.

In addition, computer-readable program instructions may be loaded into a computer, other programmable devices, or other devices and may generate a computer-implemented process by executing a series of operational steps so that instructions executed on the computer, other programmable devices, or other devices implement the functions specified in the flowcharts and block diagrams of the present disclosure.

FIG. 2 is a functional block diagram illustrating a networking system 800 of one or more networked computers and servers. In an embodiment, the hardware and software environment illustrated in FIG. 2 may provide an exemplary platform for implementation of software and/or methods according to the present disclosure.

As shown in FIG. 2, the networking system 800 may include a computer 805, a network 810, a remote computer 815, a web server 820, a cloud storage server 825, and a computer server 830, but it is not limited thereto. In some embodiments, a plurality of instances of one or more functional blocks shown in FIG. 2 may be employed.

Additional details of the computer 805 are shown in FIG. 2. The functional blocks shown within the computer 805 are provided only to establish exemplary functionality and are not intended to be exhaustive. In addition, although no details are provided for the remote computer 815, web server 820, cloud storage server 825, and computer server 830, these other computers and devices may have functions similar to those illustrated with respect to the computer 805.

The computer 805 may be a personal computer (PC), desktop computer, laptop computer, tablet computer, netbook computer, personal digital assistant (PDA), smartphone, or any other programmable electronic devices capable of communicating with another devices on the network 810.

The computer 805 may include a processor 835, a bus 837, a memory 840, a non-volatile storage 845, a network interface 850, a peripheral interface 855, and a display interface 865. These functions may be implemented in some embodiments as separate electronic subsystems (integrated circuit chips or combinations of devices associated with chips), or some combination of functions may be implemented on a single chip (which may be called a system-on-chip or SoC) in other embodiments.

The processor 835 may be one or more single or multi-chip microprocessors.

The bus 837 may be an independent standard high-speed parallel or serial peripheral interconnection bus, such as ISA, PCI, PCI Express (PCI-e), AGP, etc.

The memory 840 and the non-volatile storage 845 may be computer-readable storage mediums. The memory 840 may include any suitable volatile storage device, such as dynamic random access memory (DRAM), static random access memory (SRAM), etc. The non-volatile storage 845 may include one or more of flexible disks, hard disks, solid-state drives (SSD), read-only memory (ROM), programmable read-only memory (EPROM or flash), compact disks (CD or CD-ROM), digital versatile disks (DVD), memory cards, or sticks.

The programs 848 may be a set of machine-readable instructions and/or data used to create, manage, and control certain software functions stored in the non-volatile storage 845, described in detail elsewhere in the present disclosure and shown in the drawings. In some embodiments, the memory 840 may be significantly faster than the non-volatile storage 845. In the present embodiment, the program 848 may be transferred from the non-volatile storage 845 to the memory 840 prior to execution by the processor 835.

The computer 805 may communicate and converse with other computers over the network 810 via the network interface 850. The network 810 may include, for example, a local area network (LAN), a wide area network (WAN), such as the Internet, or a combination of both, wired, wireless, or fiber optic connections. In general, the network 810 may be any combination of connections and protocols that support communication between two or more computers and associated devices.

The peripheral interface 855 may enable input and output of data between the computer 805 and other devices that may be connected locally. For example, the peripheral interface 855 may provide connection to an external device 860. The external device 860 may include devices, such as a keyboard, mouse, keypad, touch screen, and/or other suitable input device. The external devices 860 may also include portable computer-readable storage mediums, such as thumb drives, portable optical or magnetic disks, and memory cards, for example. Software and data used in embodiments of the present disclosure may be stored, for example, in the program 848, a portable computer-readable storage medium, etc. In the present embodiment, software may be loaded into the non-volatile storage 845 or alternatively directly into the memory 840 via the peripheral interface 855. The peripheral interface 855 may connect to the external device 860 using industry standard connections, such as RS-232 or universal serial bus (USB).

The display interface 865 may connect the computer 805 to the display 870. The display 870 may be used in some embodiments to present a command line or graphical user interface to a user of the computer 805. The display interface 865 may connect to the display 870 using one or more independent connections or industry standard connections, such as VGA, DVI, Display Port, or HDMI (registered trademark).

As described above, the network interface 850 provides communication with other computing systems and storage systems or devices outside the computer 805. Software programs and data described herein may be downloaded to the non-volatile storage 845 from, for example, the remote computers 815, the web servers 820, the cloud storage servers 825, and the computer server 830 via the network interface 850 and the network 810. In addition, the system and method described in the present disclosure may be executed by one or more computers connected to the computer 805 via the network interface 850 and the network 810. For example, in some embodiments, the system and method described in the present disclosure may be executed by the remote computer 815, the computer server 830, or a combination of interconnected computers on the network 810.

Data, data sets, and/or databases used in embodiments of implementation of the system and method described in the present disclosure may be stored or downloaded from the remote computers 815, the web servers 820, the cloud storage servers 825, and the computer server 830.

<Plasma Processing Apparatus>

Figure 3:
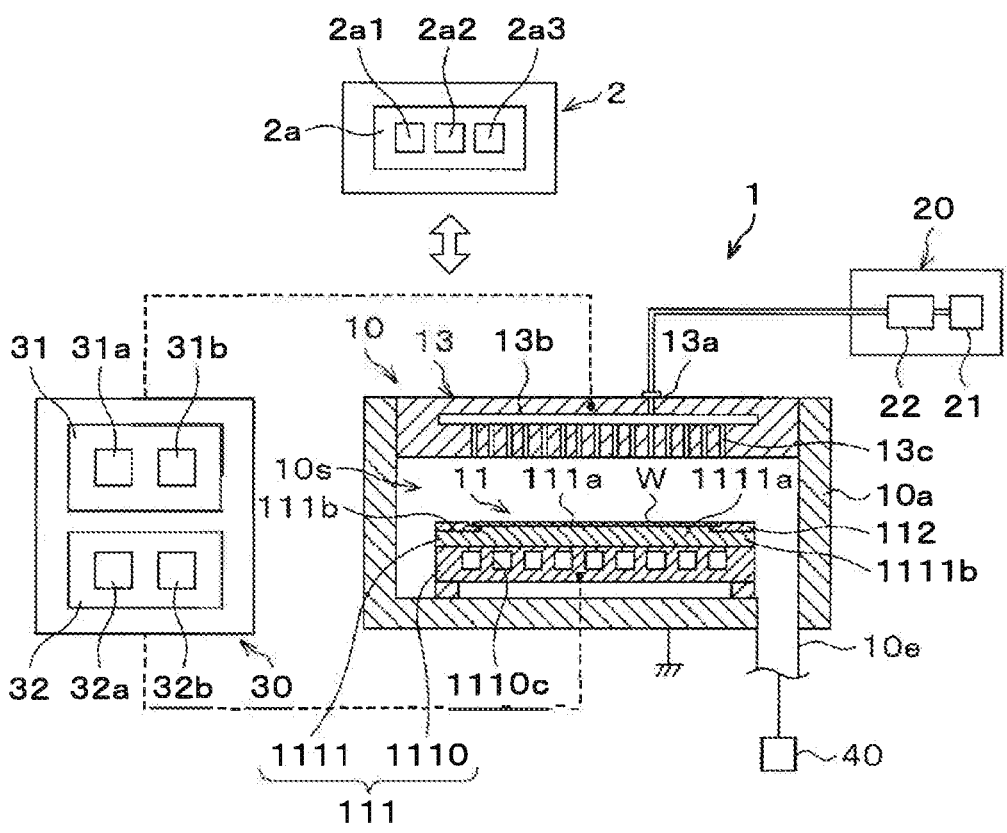
FIG. 3 is a diagram illustrating a configuration example of a capacitively coupled plasma processing apparatus.

Hereinafter, a configuration of a capacitively coupled plasma processing apparatus as an example of the plasma processing apparatus 1 is described. FIG. 3 is a diagram illustrating a configuration example of a capacitively coupled plasma processing apparatus.

The capacitively coupled plasma processing apparatus 1 includes a plasma processing chamber 10, a gas supply 20, a power source 30, and an exhaust system 40. In addition, the plasma processing apparatus 1 includes a substrate support portion 11 as an example of a substrate support and a gas introduction portion. The gas introduction portion is configured to introduce at least one processing gas into the plasma processing chamber 10. The gas introduction portion includes a showerhead 13. The substrate support portion 11 is disposed within the plasma processing chamber 10. The showerhead 13 is disposed above the substrate support portion 11. In an embodiment, showerhead 13 constitutes at least a portion of the ceiling of plasma processing chamber 10. The plasma processing chamber 10 has a plasma processing space 10s defined by the showerhead 13, a side wall 10a of the plasma processing chamber 10, and the substrate support portion 11. The plasma processing chamber 10 is grounded. The showerhead 13 and the substrate support portion 11 are electrically insulated from a housing of the plasma processing chamber 10.

The substrate support portion 11 includes a body portion 111 and a ring assembly 112. The body portion 111 has a central region 111a for supporting a substrate W and an annular region 111b for supporting the ring assembly 112. A wafer is an example of the substrate W. The annular region 111b of the body portion 111 surrounds the central region 111a of the body portion 111 in a plan view. The substrate W is disposed on the central region 111a of the body portion 111, and the ring assembly 112 is disposed on the annular region 111b of the body portion 111 to surround the substrate W on the central region 111a of the body portion 111. Accordingly, the central region 111a is also called a substrate support surface for supporting the substrate W, and the annular region 111b is also called a ring support surface for supporting the ring assembly 112.

In an embodiment, the body portion 111 includes a base 1110 and an electrostatic chuck 1111. The base 1110 includes a conductive member, such as aluminum, for example, and has a substantially disk shape. The conductive member of the base 1110 may function as a lower electrode. The electrostatic chuck 1111 is disposed on the base 1110. The electrostatic chuck 1111 includes a first dielectric portion 1111a and a second dielectric portion 1111b. In an embodiment, the first dielectric portion 1111a has a central region 111a in which the substrate W is loaded. The second dielectric portion 1111b has an annular region 111b in which the ring assembly 112 is loaded. The second dielectric portion 1111b is disposed to surround the first dielectric portion 1111a.

In addition, another member surrounding the electrostatic chuck 1111, such as an annular electrostatic chuck or an annular insulating member, may have the annular region 111b. In this case, the ring assembly 112 may be disposed on the annular electrostatic chuck or the annular insulating member or may be disposed on both the electrostatic chuck 1111 and the annular insulating member. In addition, at least one RF/DC electrode coupled to an RF power source 31 and/or a DC power source 32, which is described below, may be disposed within the electrostatic chuck 1111. In this case, at least one RF/DC electrode functions as a lower electrode. When a bias RF signal and/or DC signal described below is supplied to at least one RF/DC electrode, the RF/DC electrode is also called a bias electrode. In addition, the conductive member of the base 1110 and at least one RF/DC electrode may function as a plurality of lower electrodes. In addition, the electrode in the electrostatic chuck 1111 may function as a lower electrode. Accordingly, the substrate support portion 11 includes at least one lower electrode.

The ring assembly 112 includes one or a plurality of annular members. In an embodiment, the one or the plurality of annular members include one or more edge rings and at least one cover ring. The edge ring is formed of a conductive material or an insulating material, and the cover ring is formed of an insulating material. In addition, the covering may be omitted.

In addition, the substrate support portion 11 may include a temperature control module configured to adjust at least one of the electrostatic chuck 1111, the ring assembly 112, and the substrate W to a target temperature. The temperature control module may include a heater, a heat transfer medium, a flow path 1110c, or combinations thereof. A heat transfer fluid, such as brine or gas flows through the flow path 1110c. In an embodiment, the flow path 1110c is formed in the base 1110, and one or a plurality of heaters are disposed in the electrostatic chuck 1111. In addition, the substrate support portion 11 may include a heat transfer gas supplier configured to supply heat transfer gas to a gap between a rear surface of the substrate W and the central region 111a.

The showerhead 13 is configured to introduce at least one processing gas from the gas supplier 20 into the plasma processing space 10s. The showerhead 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. In addition, the showerhead 13 includes at least one upper electrode. In addition, the gas introduction portion may include one or more side gas injectors (SGI) attached to one or more openings formed in the side wall 10a, in addition to the showerhead 13.

The gas supplier 20 may include at least one gas source 21 and at least one flow rate controller 22. In an embodiment, the gas supplier 20 is configured to supply at least one processing gas to the showerhead 13 from a respective corresponding gas source 21 through a respective corresponding flow rate controller 22. Each flow rate controller 22 may include, for example, a mass flow rate controller or a pressure-controlled flow rate controller. In addition, the gas supplier 20 may include at least one flow rate modulation device that modulates or pulses the flow rate of at least one processing gas.

The power source 30 includes an RF power source 31 coupled to the plasma processing chamber 10 through at least one impedance matching circuit. The RF power source 31 is configured to supply at least one RF signal (RF power) to at least one lower electrode and/or at least one upper electrode. Accordingly, plasma is formed from the at least one processing gas supplied to the plasma processing space 10s. Accordingly, the RF power source 31 may function as at least a portion of the plasma generator 12. In addition, by supplying a bias RF signal to at least one lower electrode, a bias potential is generated in the substrate W and ion components in the formed plasma may be introduced into the substrate W.

In an embodiment, the RF power source 31 includes a first RF generator 31a and a second RF generator 31b. The first RF generator 31a is coupled to at least one lower electrode and/or at least one upper electrode through at least one impedance matching circuit to generate a source RF signal (source RF power) for plasma generation. In an embodiment, the source RF signal has a frequency in the range of 10 MHz to 150 MHz. In an embodiment, the first RF generator 31a may be configured to generate a plurality of source RF signals having different frequencies. One or a plurality of generated source RF signals are supplied to at least one lower electrode and/or at least one upper electrode.

The second RF generator 31b is coupled to at least one lower electrode through at least one impedance matching circuit to generate a bias RF signal (bias RF power). The frequency of the bias RF signal may be the same or different from the frequency of the source RF signal. In an embodiment, the bias RF signal has a lower frequency than the frequency of the source RF signal. In an embodiment, the bias RF signal has a frequency in the range of 100 kHz to 60 MHz. In an embodiment, the second RF generator 31b may be configured to generate a plurality of bias RF signals having different frequencies. One or a plurality of bias RF signals generated are supplied to at least one lower electrode. In addition, in various embodiments, at least one of the source RF signal and the bias RF signal may be pulsed.

In addition, the power source 30 may include a DC power source 32 coupled to the plasma processing chamber 10. The DC power source 32 includes a first DC generator 32a and a second DC generator 32b. In an embodiment, the first DC generator 32a is connected to at least one lower electrode to generate a first DC signal. The generated first DC signal is applied to at least one lower electrode. In an embodiment, the second DC generator 32b is connected to at least one upper electrode to generate a second DC signal. The generated second DC signal is applied to at least one upper electrode.

In various embodiments, the first and second DC signals may be pulsed. In this case, a sequence of voltage pulses is applied to at least one lower electrode and/or at least one upper electrode. The voltage pulse may have a rectangular, trapezoidal, triangular pulse waveform, or combinations thereof. In an embodiment, a waveform generator for generating a sequence of voltage pulses from the DC signal is connected between the first DC generator 32a and the at least one lower electrode. Accordingly, the first DC generator 32a and the waveform generator constitute a voltage pulse generator. When the second DC generator 32b and the waveform generator constitute a voltage pulse generator, the voltage pulse generator is connected to at least one upper electrode. The voltage pulse may have positive polarity or negative polarity. In addition, the sequence of voltage pulses may include one or a plurality of positive polarity voltage pulses and one or a plurality of negative polarity voltage pulses within one cycle. In addition, the first and second DC generators 32a and 32b may be installed in addition to the RF power source 31, and the first DC generator 32a may be installed instead of the second RF generator 31b.

The exhaust system 40 may be connected to, for example, a gas discharge port 10e installed at the bottom of the plasma processing chamber 10. The exhaust system 40 may include a pressure regulating valve and a vacuum pump. The pressure within the plasma processing space 10s is regulated by the pressure regulating valve. The vacuum pump may include a turbomolecular pump, a dry pumps, or combinations thereof.

<Substrate Support Portion>

Hereinafter, the configuration of the aforementioned substrate support portion 11 is described by giving examples of a plurality of embodiments.

First Embodiment

Figure 4:
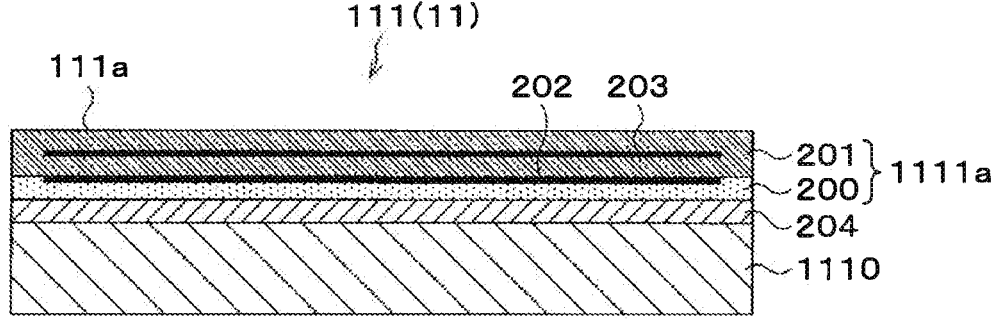
FIG. 4 is a cross-sectional view schematically illustrating a configuration of a body portion of the substrate support according to a first embodiment.

FIG. 4 is a cross-sectional view schematically illustrating a configuration of a body portion of a substrate support portion according to the first embodiment. In addition, in the first embodiment, the configuration of the first dielectric portion 1111a is featured, and in the example of FIG. 4, illustration of the second dielectric portion 1111b is omitted.

The first dielectric portion 1111a includes a sprayed layer 200 and a sintered layer 201. The sprayed layer 200 is formed by thermally spraying an insulating material, for example, ceramic, such as $Al_2O_3$ (aluminum oxide, alumina). The sintered layer 201 is formed of a sintered plate of an insulating material, for example, ceramic, such as $Al_2O_3$. The sintered layer 201 is disposed on the top of the sprayed layer 200, and an upper surface of the sintered layer 201 forms the central region 111a (substrate support surface) for supporting the substrate W.

Inside the sprayed layer 200, a heater electrode 202 is provided to control the temperature of the substrate W. The heater electrode 202 is formed by thermally spraying a conductive material, for example, metal. Inside the sintered layer 201, an electrostatic electrode 203 is provided to adsorb/attract the substrate W. The electrostatic electrode 203 is formed by sintering a conductive material, for example, metal.

In addition, the arrangement of the heater electrode 202 and the electrostatic electrode 203 is not limited to the present embodiment. For example, the heater electrode 202 may be disposed at the interface between the sprayed layer 200 and the sintered layer 201. In addition, the heater electrode 202 and the electrostatic electrode 203 may be separated. In addition, a bias electrode (not shown) to which DC or AC bias power is supplied may be installed inside the first dielectric portion 1111a.

The first dielectric portion 1111a is disposed on the base 1110 through a bonding layer 204. The bonding layer 204 functions as an adhesive that bonds the sprayed layer 200 to the base 1110. The bonding layer 204 is formed of a material having plasma resistance and heat resistance, for example, acrylic resin, silicone resin, epoxy resin, etc.

As described above, the first dielectric portion 1111a has a hybrid structure including the sprayed layer 200 and the sintered layer 201.

Here, the sprayed layer 200 has the advantage of reducing the manufacturing cost due to a short manufacturing period. Meanwhile, when the RF power of the sprayed layer 200 is large or power supplied to the electrostatic electrode 203 is large, there is a risk that abnormal discharge may occur and the sprayed layer 200 may be deteriorated. In addition, the sprayed layer 200 has a low density, so it is prone to surface changes over time when exposed to plasma. Therefore, compared to the sintered layer 201, the sprayed layer 200 has low plasma resistance, resulting in a shorter lifespan than that of the sintered layer 201. Therefore, the sprayed layer 200 is disposed on a non-exposed side of plasma.

The sintered layer 201 may be used even when the RF power is large and the power supplied to the electrostatic electrode 203 is large, and thus, the sintered layer 201 may respond to increased power. In addition, the sintered layer 201 has high plasma resistance, a long lifespan, and generates less dust. Meanwhile, the sintered layer 201 has a long manufacturing period and high manufacturing cost. Therefore, the sintered layer 201 is disposed only on an exposed side of plasma.

According to the present embodiment, the first dielectric portion 1111a has both advantages of the sprayed layer 200 and the advantages of the sintered layer 201. In other words, it is possible to achieve higher power and longer life in the sintered layer 201 on the exposed side of plasma, while shortening the manufacturing period (lead time) and lowering the manufacturing cost in the sprayed layer 200 on the non-exposed side of plasma.

In addition, since the heater electrode 202 is formed by thermally spraying, the manufacturing period for the heater electrode 202 may be shortened and the manufacturing cost may be reduced. As a result, it is possible to easily manufacture the heater electrode 202 according to, for example, a certain heater pattern.

In addition, in the present embodiment, when manufacturing the first dielectric portion 1111a, the sintered layer 201 having the electrostatic electrode 203 therein is prepared, and then the sprayed layer 200 and the heater electrode 202 are formed on the sintered layer 201 by thermally spraying. Thereafter, the sprayed layer 200 is bonded to the base 1110 through the bonding layer 204. At this time, since the bonding layer 204 is a flexible adhesive, the sprayed layer 200 and the base 1110 may be appropriately bonded. In addition, it is possible to reduce thermal resistance by using the bonding layer 204.

As described above, the substrate support portion 11 preferably includes the bonding layer 204 for manufacturing purposes. However, as described above, from the viewpoint of demonstrating the advantages of the sprayed layer 200 and the sintered layer 201, the bonding layer 204 may be omitted.

Second Embodiment

Figure 5:
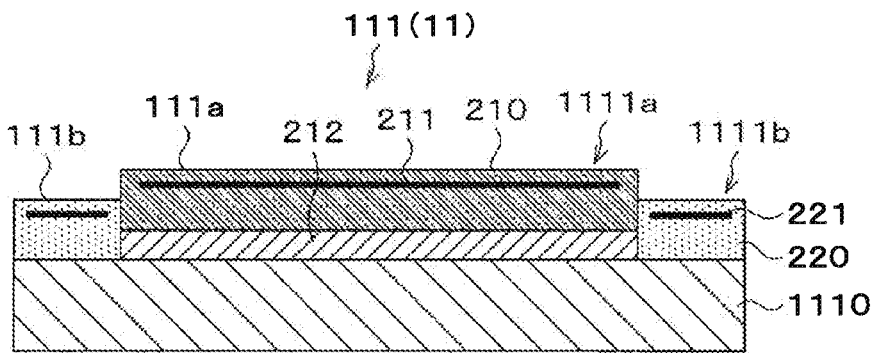
FIG. 5 is a cross-sectional view schematically illustrating a configuration of a body portion of a substrate support according to a second embodiment.

FIG. 5 is a cross-sectional view schematically illustrating a configuration of the body portion of the substrate support according to the second embodiment.

The first dielectric portion 1111a includes the sintered layer 210. The sintered layer 210 is formed of a sintered plate of an insulating material, for example, ceramic, such as $Al_2O_3$. The upper surface of the sintered layer 210 constitutes a central region 111a (substrate support surface) for supporting the substrate W.

Inside the sintered layer 210, a first electrostatic electrode 211 is installed to adsorb the substrate W. The first electrostatic electrode 211 is formed by sintering a conductive material, for example, metal. In addition, the first electrostatic electrode 211 may be divided. In addition, a heater electrode (not shown) for heating the substrate W or a bias electrode (not shown) to which DC or AC bias power is supplied may be installed inside the sintered layer 201.

The first dielectric portion 1111a is disposed on the base 1110 through the bonding layer 212. The bonding layer 212 is formed of the same material as that of the bonding layer 204 of the first embodiment, and functions as an adhesive that bonds the sintered layer 210 to the base 1110.

The second dielectric portion 111b surrounds the first dielectric portion 111a and includes the sprayed layer 220. The sprayed layer 220 is formed by thermally spraying an insulating material, for example, ceramic, such as $Al_2O_3$, onto the outer periphery of the base 1110. An upper surface of the sprayed layer 220 forms an annular region 111b (a ring support surface) for supporting the ring assembly 112. In addition, the arrangement of the first dielectric portion 111a and the second dielectric portion 111b is not limited to the present embodiment. For example, the first dielectric portion 111a and the second dielectric portion 111b may be separated to suppress mutual thermal interference between the first dielectric portion 111a and the second dielectric portion 111b.

Inside the sprayed layer 220, a second electrostatic electrode 221 is provided to adsorb the ring assembly 112. The second electrostatic electrode 221 is formed by thermally spraying a conductive material, for example, metal. In addition, the second electrostatic electrode 221 may be divided. In addition, a heater electrode (not shown) for heating the substrate W or a bias electrode (not shown) to which DC or AC bias power is supplied may be provided inside the sprayed layer 220.

Here, a set value of a temperature of the edge ring of the ring assembly 112 may be required to be lower than the temperature of the substrate W. However, an adsorption area of the ring support surface of the annular region 111b is smaller than an area in which the edge ring is exposed to plasma. Due to this, it is necessary to improve heat generating ability of the second dielectric portion 1111b supporting the ring assembly 112.

However, in the related art, since the second dielectric portion has a sintered layer formed of an insulating material and the corresponding sintered layer is disposed on the base through a bonding layer, a heat generating ability exceeding that of the bonding layer may be required in some cases. In addition, in order to improve the heat generating ability, a heat transfer gas, e.g., He gas, may be supplied between the sintered layer of the second dielectric portion and the edge ring. In this case, there is a risk of abnormal discharge occurring in a lower surface of the edge ring.

In the present embodiment, the sprayed layer 220 of the second dielectric portion 1111b is disposed directly on the base 1110 without a bonding layer interposed therebetween. Due to this, heat generating ability may be improved. In addition, by configuring the second dielectric portion 1111b with the sprayed layer 220, it is possible to shorten the manufacturing period and reduce the manufacturing cost.

Third Embodiment

Figure 6:
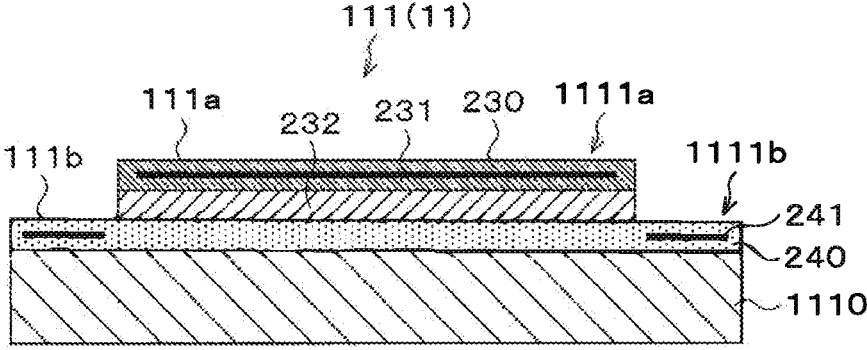
FIG. 6 is a cross-sectional view schematically illustrating a configuration of a body portion of a substrate support according to a third embodiment.

FIG. 6 is a cross-sectional view schematically illustrating a configuration of the body portion of the substrate support portion according to a third embodiment. The third embodiment is a modification of the second embodiment.

The first dielectric portion 1111a includes a sintered layer 230. The sintered layer 230 is formed of a sintered plate of an insulating material, for example, ceramic, such as $Al_2O_3$.

An upper surface of the sintered layer 230 constitutes the central region 111a (the substrate support surface) for supporting the substrate W.

Inside the sintered layer 230, a first electrostatic electrode 231 is provided to adsorb the substrate W. The first electrostatic electrode 231 is formed by sintering a conductive material, for example, metal. In addition, the first electrostatic electrode 231 may be divided.

The first dielectric portion 1111a is disposed on a sprayed layer 240, which is described below, through a bonding layer 232. The bonding layer 232 is formed of the same material as that of the bonding layer 212 of the second embodiment and functions as an adhesive for bonding the sintered layer 230 to the sprayed layer 240 to be described below.

The second dielectric portion 1111b includes the sprayed layer 240. The sprayed layer 240 is formed by thermally spraying an insulating material, for example, ceramic, such as $Al_2O_3$, onto the entire surface of the base 1110. That is, the sprayed layer 240 is disposed to elongate to a lower portion of the first dielectric portion 1111a. An upper outer periphery of the sprayed layer 240 constitutes the annular region 111b (the ring support surface) for supporting the ring assembly 112.

A second electrostatic electrode 241 for adsorbing the ring assembly 112 is installed on an inner periphery of the sprayed layer 240. The second electrostatic electrode 241 is formed by thermally spraying a conductive material, for example, metal. In addition, the second electrostatic electrode 241 may be divided.

In the present embodiment as well, the same effects as those in the second embodiment may be achieved. That is, since the sprayed layer 240 of the second dielectric portion 111b is disposed directly on the base 1110 without a bonding layer interposed therebetween, heat generating ability may be improved. In addition, by configuring the second dielectric portion 111b with the sprayed layer 240, it is possible to shorten the manufacturing period and reduce the manufacturing cost.

Fourth Embodiment

Figure 7:
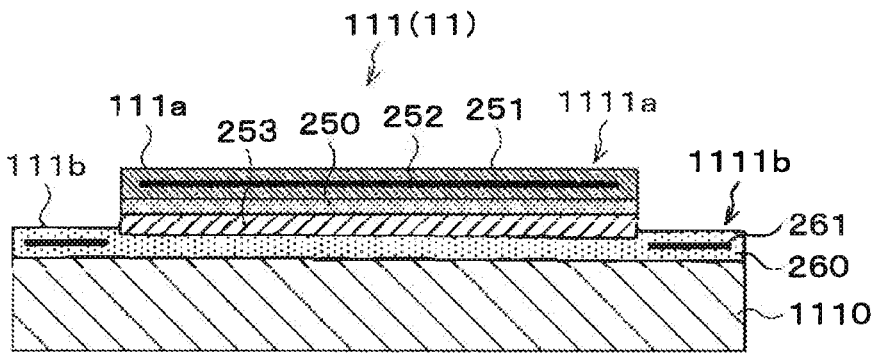
FIG. 7 is a cross-sectional view schematically illustrating a configuration of a body portion of a substrate support according to a fourth embodiment.

FIG. 7 is a cross-sectional view schematically illustrating a configuration of the body portion of the substrate support according to a fourth embodiment. The fourth embodiment is an example that combines the first and third embodiments.

The first dielectric portion 1111a includes a first sprayed layer 250 and a sintered layer 251. The first sprayed layer 250 is formed by thermally spraying an insulating material, for example, ceramic, such as $Al_2O_3$. The sintered layer 251 is formed of a sintered plate of an insulating material, for example, ceramic, such as $Al_2O_3$. The sintered layer 251 is disposed on the first sprayed layer 250, and an upper surface of the sintered layer 251 constitutes the central region 111a (the substrate support surface) for supporting the substrate W.

Inside the sintered layer 251, a first electrostatic electrode 252 is provided to adsorb the substrate W. The first electrostatic electrode 252 is formed by sintering a conductive material, for example, metal. In addition, the first electrostatic electrode 252 may be divided.

The first dielectric portion 1111a is disposed on a second sprayed layer 260, which is described below, through the bonding layer 253. The bonding layer 253 is formed of the same material as that of the bonding layer 204 of the first embodiment and functions as an adhesive for bonding the first sprayed layer 250 to the second sprayed layer 260.

The second dielectric portion 1111b includes the second sprayed layer 260. The second sprayed layer 260 is formed by thermally spraying an insulating material, for example, ceramic, such as $Al_2O_3$, onto the entire surface of the base 1110. That is, the second sprayed layer 260 is disposed to elongate to a lower portion of the first dielectric portion 1111a. An outer periphery of an upper surface of the second sprayed layer 260 constitutes the annular region 111b (the ring support surface) for supporting the ring assembly 112.

A second electrostatic electrode 261 for adsorbing the ring assembly 112 is installed on an inner periphery of the second sprayed layer 260. The second electrostatic electrode 261 is formed by thermally spraying a conductive material, for example, metal. In addition, the second electrostatic electrode 261 may be divided.

According to the present embodiment, both the effects of the first embodiment and the effects of the third embodiment may be achieved. That is, in the first dielectric portion 1111a, high power and long service life are realized by the sintered layer 251 on the exposed side of plasma, while the manufacturing period is shortened and manufacturing cost may be reduced by the first sprayed layer 250 on the non-exposed side of plasma. In addition, in the second dielectric portion 1111b, since the second sprayed layer 260 is disposed directly on the base 1110 without a bonding layer interposed therebetween, heat generating ability may be improved. In addition, by configuring the second dielectric portion 1111b with the second sprayed layer 260, it is possible to shorten the manufacturing period and reduce the manufacturing cost.

In addition, in the present embodiment, although a thermal spraying material of the first sprayed layer 250 and a thermal spraying material of the second sprayed layer 260 are the same, these thermal spraying materials may be different.

Fifth Embodiment

Figure 8:
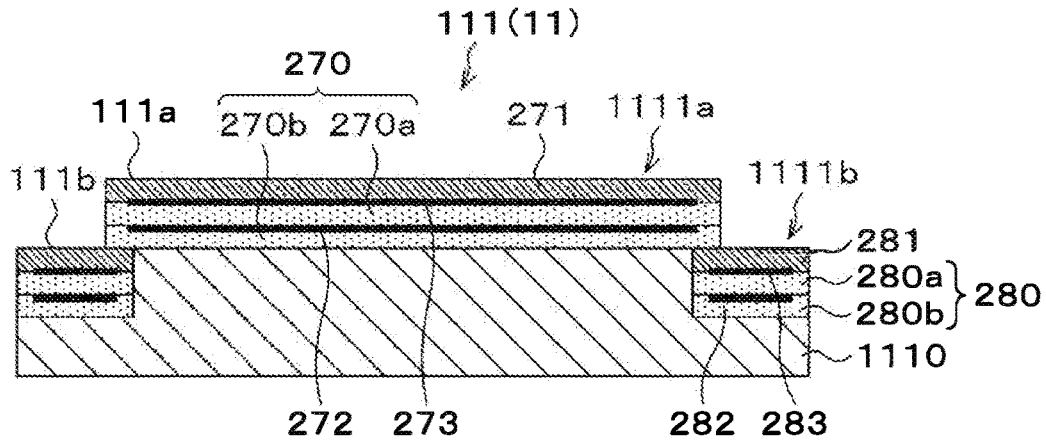
FIG. 8 is a cross-sectional view schematically illustrating a configuration of a body portion of a substrate support according to a fifth embodiment.

FIG. 8 is a cross-sectional view schematically illustrating a configuration of the body portion of the substrate support according to a fifth embodiment.

The first dielectric portion 1111a includes a first sprayed layer 270 and a first sintered layer 271. In addition, the first sprayed layer 270 includes a plurality of stacked first sprayed layers, for example, two first sprayed layers 270a and 270b. A first upper sprayed layer 270a disposed on the upper side is formed by thermally spraying an insulating material, for example, ceramic, such as $Al_2O_3$. The first lower sprayed layer 270b disposed on the lower side is also formed by thermally spraying an insulating material, for example, ceramic, such as $Al_2O_3$. The first sintered layer 271 is formed of a sintered plate of an insulating material, for example, ceramic, such as $Al_2O_3$. The first sintered layer 271 is disposed on the first sprayed layer 270, and an upper surface of the first sintered layer 271 constitutes the central region 111a (the substrate support surface) for supporting the substrate W.

A thickness of the first upper sprayed layer 270a is appropriately adjusted depending on, for example, a distance between a first bias electrode 272 and a first electrostatic electrode 273, which is described below. The thickness of the first lower sprayed layer 270b is appropriately adjusted depending on, for example, a distance between the first electrostatic electrode 273 and the base 1110, which is described below.

The first bias electrode 272 to which DC pulse bias power for controlling a plasma potential is supplied is provided at an interface between the first upper sprayed layer 270a and the first lower sprayed layer 270b. The first bias electrode 272 is formed by thermally spraying a conductive material, for example, metal, onto the first upper sprayed layer 270a. In addition, the first bias electrode 272 is formed coaxially with an outer diameter dimension. In addition, the first bias electrode 272 may be divided.

The first electrostatic electrode 273 for adsorbing the substrate W is provided at an interface between the first sintered layer 271 and the first upper sprayed layer 270a. The first electrostatic electrode 273 is formed by thermally spraying a conductive material, for example, metal, onto the first sintered layer 271. In addition, the first electrostatic electrode 273 is formed to have an external dimension and be unipolar, bipolar, or coaxial, as required, and an electrode structure for conduction is formed. In addition, the first electrostatic electrode 273 may be divided.

In addition, the arrangement of the first bias electrode 272 and the first electrostatic electrode 273 is not limited to the present embodiment. For example, the first electrostatic electrode 273 may be installed inside the first sintered layer 271. In this case, the first electrostatic electrode 273 is formed by sintering a conductive material, for example, metal.

The second dielectric portion 1111b includes a second sprayed layer 280 and a second sintered layer 281. In addition, the second sprayed layer 280 includes a plurality of stacked sprayed layers, for example, two second sprayed layers 280a and 280b. The second upper sprayed layer 280a disposed on the upper side is formed by thermally spraying an insulating material, for example, ceramic, such as Al₂O₃. The second lower sprayed layer 280b disposed on the lower side is also formed by thermally spraying an insulating material, for example, ceramic, such as Al₂O₃. The second sintered layer 281 is formed of a sintered plate of an insulating material, for example, ceramic, such as Al₂O₃. The second sintered layer 281 is disposed on the second sprayed layer 280, and an upper surface of the second sintered layer 281 constitutes the annular region 111b (the ring support surface) for supporting the ring assembly 112.

The thickness of the second upper sprayed layer 280a is appropriately adjusted depending on, for example, a distance between the second bias electrode 282 and the second electrostatic electrode 283, which is described below. A thickness of the second lower sprayed layer 280b is appropriately adjusted depending on, for example, a distance between the second electrostatic electrode 283 and the base 1110, which is described below.

The second bias electrode 282 to which DC pulse bias power is supplied is installed at an interface between the second upper sprayed layer 280a and the second lower sprayed layer 280b. The second bias electrode 282 is formed by thermally spraying a conductive material, for example, metal, onto the second upper sprayed layer 280a. In addition, the second bias electrode 282 is formed coaxially with an outer diameter dimension. In addition, the second bias electrode 282 may be divided.

The second electrostatic electrode 283 for adsorbing the substrate W is provided at an interface between the second sintered layer 281 and the second upper sprayed layer 280a. The second electrostatic electrode 283 is formed by thermally spraying a conductive material, for example, metal, onto the second sintered layer 281. In addition, the second electrostatic electrode 283 is formed to have an external dimension and be unipolar, bipolar, or coaxial as required, and an electrode structure for conduction is formed. In addition, the second electrostatic electrode 283 may be divided.

In addition, the arrangement of the second bias electrode 282 and the second electrostatic electrode 283 is not limited to the present embodiment. For example, the second electrostatic electrode 283 may be installed inside the second sintered layer 281. In this case, the second electrostatic electrode 283 is formed by sintering a conductive material, for example, metal. In addition, the second bias electrode 282 and the second electrostatic electrode 283 may also be omitted.

According to the present embodiment, the first dielectric portion 1111a realizes higher power and longer life with the first sintered layer 271 on the exposed side of plasma, while shortening the manufacturing period and lowering the manufacturing cost with the first sprayed layer 270 on the non-exposed side of plasma. The second dielectric portion 1111b may also achieve the same effect as that of the first dielectric portion 1111a.

In addition, in the present embodiment, although the first dielectric portion 111a includes the first sprayed layer 270 and the second dielectric portion 111b includes the second sprayed layer 280. Either of the first dielectric portion 111a and the second dielectric portion 111b may be formed only with the sintered layer.

In addition, according to the present embodiment, the first sprayed layer 270 includes a plurality of first sprayed layers 270a and 270b, so a distance between the first bias electrode 272 and the substrate W may be controlled, thereby improving power efficiency. The second sprayed layer 280 may also achieve the same effect as that of the first sprayed layer 270.

In addition, the number of stacks of the first sprayed layer 270 and the second sprayed layer 280 is not limited to the present embodiment. For example, the number of stacks may be one layer or three layers or more.

In addition, in the present embodiment, a thermal spray material of the first upper sprayed layer 270a and a thermal spray material of the first lower sprayed layer 270b are the same, but these thermal spray materials may be different. In this case, it is possible to take advantage of the characteristics of each layer, and for example, a thermal spray material according to the contained electrode may be used.

In addition, according to the present embodiment, since the first bias electrode 272 and the first electrostatic electrode 273 are each formed by thermally spraying, the manufacturing period of these electrodes 272 and 273 may be shortened and the manufacturing cost may be reduced. As a result, it is possible to easily manufacture the electrodes 272 and 273 according to a certain pattern, for example.

In addition, in the present embodiment, the first bias electrode 272 and the second bias electrode 282 may be disposed to overlap each other in a plan view. In this case, impedance may be controlled by adjusting parasitic capacitance that occurs between the first bias electrode 272 and the second bias electrode 282, and the amount of bias RF signal propagating toward the substrate W and the ring assembly 112 may be controlled.

In the present embodiment, when manufacturing the first dielectric portion 1111a, first, the first sintered layer 271 is prepared. Thereafter, the first electrostatic electrode 273, the first upper sprayed layer 270a, the first bias electrode 272, and the first lower sprayed layer 270b are sequentially formed on the first sintered layer 271 by thermal spraying. When forming the first electrostatic electrode 273 and the first bias electrode 272, a pattern may be formed by direct thermal spraying using a mask or a pattern may be formed by machining or firing after the entire surface spraying.

In addition, in the present embodiment, although not shown, after manufacturing the first dielectric portion 1111a, the first lower sprayed layer 270b may be bonded to the base 1110 through a first bonding layer (not shown). A flexible adhesive is provided in the first bonding layer, and the first lower sprayed layer 270b and the base 1110 may be appropriately bonded. In addition, it is possible to lower thermal resistance by the first bonding layer.

The second dielectric portion 1111b may also be manufactured in the same manner as that of the first dielectric portion 1111a. In addition, the second lower sprayed layer 280b may be bonded to the base 1110 in the second dielectric portion 1111b through a second bonding layer (not shown).

Sixth Embodiment

Figure 9:
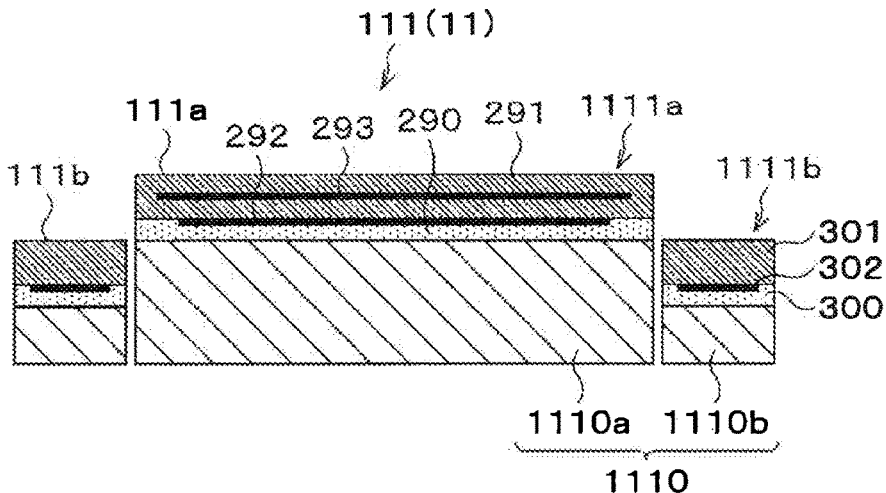
FIG. 9 is a cross-sectional view schematically illustrating a configuration of a body portion of a substrate support according to a sixth embodiment.

FIG. 9 is a cross-sectional view schematically illustrating a configuration of the body portion of the substrate support portion according to a sixth embodiment. The sixth embodiment is a modification of the fifth embodiment.

In the present embodiment, the first dielectric portion 1111a and the second dielectric portion 1111b are disposed to be apart from each other. In addition, the base 1110 includes a first base 1110a and a second base 1110b, and the first base 1110a and the second base 1110b are arranged to be spaced apart from each other. The first base 1110a is a base below the first dielectric portion 1111a, and the second dielectric portion 1111b is a base below the second dielectric portion 111b.

In this manner, by separating the first dielectric portion 1111a and the first base 1110a from the second dielectric portion 1111b and the second base 1110b, mutual thermal interference may be suppressed. In addition, this separation may also be applied to the first to fifth embodiments.

The first dielectric portion 1111a includes a first sprayed layer 290 and a first sintered layer 291. The first sprayed layer 290 is formed by thermally spraying an insulating material, for example, ceramic, such as $Al_2O_3$. The first sintered layer 291 is formed of a sintered plate of an insulating material, for example, ceramic, such as $Al_2O_3$. In addition, the first sprayed layer 290 may include a plurality of sprayed layers, similar to the first sprayed layer 270 of the fifth embodiment. The first sintered layer 291 is disposed on the first sprayed layer 290, and an upper surface of the first sintered layer 291 constitutes the central region 111a (the substrate support surface) for supporting the substrate W.

A first heater electrode 292 for heating the substrate W is provided at an interface between the first sintered layer 291 and the first sprayed layer 290. The first heater electrode 292 is formed by thermally spraying a conductive material, for example, metal, onto the first sintered layer 291. In addition, the first heater electrode 292 may be divided.

Inside the first sintered layer 291, a first electrostatic electrode 293 is provided to adsorb the substrate W. The first electrostatic electrode 293 is formed by sintering a conductive material, for example, metal. In addition, the first electrostatic electrode 293 may be divided.

In addition, the arrangement of the first heater electrode 292 and the first electrostatic electrode 293 is not limited to the present embodiment.

The second dielectric portion 1111b includes a second sprayed layer 300 and a second sintered layer 301. The second sprayed layer 300 is formed by thermally spraying an insulating material, for example, ceramic, such as $Al_2O_3$. In addition, the second sprayed layer 300 may include a plurality of sprayed layers, similar to the second sprayed layer 280 of the fifth embodiment. The second sintered layer 301 is formed of a sintered plate of an insulating material, for example, ceramic, such as $Al_2O_3$. The second sintered layer 301 is disposed on the second sprayed layer 300, and an upper surface of the second sintered layer 301 constitutes the annular region 111b (the ring support surface) for supporting the ring assembly 112.

A second heater electrode 302 for heating the ring assembly 112 is installed at an interface between the second sintered layer 301 and the second sprayed layer 300. The second heater electrode 302 is formed by thermally spraying a conductive material, for example, metal, onto the second sintered layer 301. In addition, the second heater electrode 302 may be divided.

In addition, a second electrostatic electrode (not shown) for adsorbing the ring assembly 112 may be provided inside the second sintered layer 301. In this case, the second electrostatic electrode is formed by sintering a conductive material, for example, metal. In addition, the second electrostatic electrode may be divided.

In the present embodiment as well, the same effects as that of the fifth embodiment may be achieved. That is, the first dielectric portion 1111a realizes higher power and longer life in the first sintered layer 291 on the exposed side of plasma, while shortening the manufacturing period and lowering the manufacturing cost in the first sprayed layer 290 on the non-exposed side of plasma. The second dielectric portion 1111b may also achieve the same effect as that of the first dielectric portion 1111a.

In addition, in the present embodiment, although the first dielectric portion 111a includes the first sprayed layer 290 and the second dielectric portion 111b includes the second sprayed layer 300. Either of the first dielectric portion 111a and the second dielectric portion 111b may be formed only with the sintered layer.

In the present embodiment, when manufacturing the first dielectric portion 1111a, after the first sintered layer 291 including the first electrostatic electrode 293 therein is prepared, the first heater electrode 292 and the first sprayed layer 290 are sequentially formed on the first sintered layer 291 by thermal spraying. When forming the first heater electrode 292, a pattern may be formed by direct thermal spraying using a mask or a pattern may be formed by machining or firing after the entire surface spraying.

In manufacturing the first dielectric portion 1111a, after the first heater electrode 292 is formed, power may be supplied to the first heater electrode 292 to measure heat generation distribution within the substrate surface. By trimming a line width of the first heater electrode 292 to correct a difference between the measured heat generation distribution and a designed heat generation distribution, individual differences in terms of manufacturing may be corrected to manufacture the first dielectric portion 1111a having excellent in-plane temperature uniformity.

In addition, in the present embodiment, although not shown, after manufacturing the first dielectric portion 1111a, the first sprayed layer 290 may be bonded to the base 1110 through a first bonding layer (not shown). A flexible adhesive may be provided in the first bonding layer, and the first sprayed layer 290 and the base 1110 may be appropriately bonded. In addition, it is possible to lower thermal resistance by the first bonding layer.

The second dielectric portion 1111b may also be manufactured in the same manner as the first dielectric portion 1111a. In addition, the second sprayed layer 300 may be bonded to the base 1110 in the second dielectric portion 1111*b* through a second bonding layer (not shown).

Embodiment 7

Figure 10:
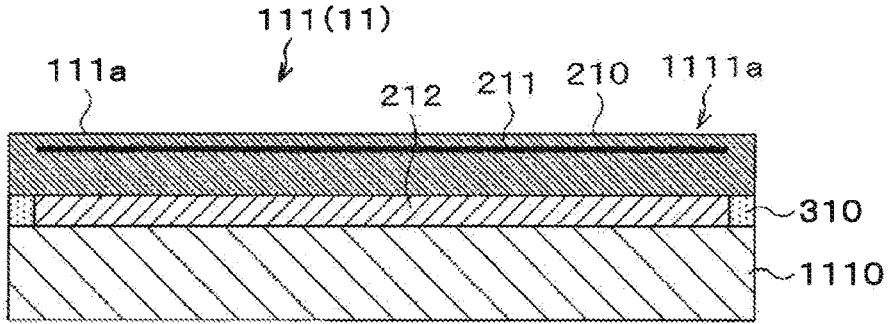
FIG. 10 is a cross-sectional view schematically illustrating a configuration of a body portion of a substrate support according to a seventh embodiment.

FIG. 10 is a cross-sectional view schematically illustrating a configuration of the body portion of the substrate support according to a seventh embodiment. In the present embodiment, the bonding layer bonding the first dielectric portion 111*a* and the base 1110 is protected in the first to sixth embodiments described above. In the following example, a case in which the bonding layer 212 in the second embodiment is protected is described. In addition, in the example of FIG. 10, illustration of the second dielectric portion 111*b* is omitted.

A diameter of the bonding layer 212 bonding the first dielectric portion 1111*a* and the base 1110 is smaller than a diameter of the first dielectric portion 1111*a*. A sprayed ring 310 as a protection member is disposed on an outer periphery of the bonding layer 212 to cover an external surface of the bonding layer 212. The sprayed ring 310 is disposed below the sintered layer 210 of the first dielectric portion 1111*a*. The sprayed ring 310 has an approximately annular shape. A thickness of the sprayed ring 310 in a radial direction is set in balance with heat generating ability, but is, for example, several mm.

The sprayed ring 310 is formed by thermally spraying an insulating material, for example, ceramic, such as $Al_2O_3$. In the present embodiment, after the sprayed ring 310 is formed in this manner, the bonding layer 212 is formed inside the sprayed ring 310, and in addition, the sintered layer 210 is performed on the bonding layer 212 and the sprayed ring 310.

Here, when the bonding layer 212 is exposed to plasma, the corresponding bonding layer 212 is consumed over time. When the bonding layer 212 is consumed, thermal resistance of that portion increases. As a countermeasure against this, it may be considered to provide, for example, an O-ring on the outer periphery of the bonding layer 212, but O-rings are difficult to construct and the cost is high. In addition, there is a risk that the O-ring may detach from the bonding layer 212.

In this regard, in the present embodiment, since the sprayed ring 310 is installed to cover the external surface of the bonding layer 212, consumption of the bonding layer 212 may be suppressed and heat generating ability may be improved. In addition, the sprayed ring 310 has the advantage of reducing manufacturing cost due to a short manufacturing period. In addition, the sprayed ring 310 does not detach from the bonding layer 212.

Eighth Embodiment

Figure 11:
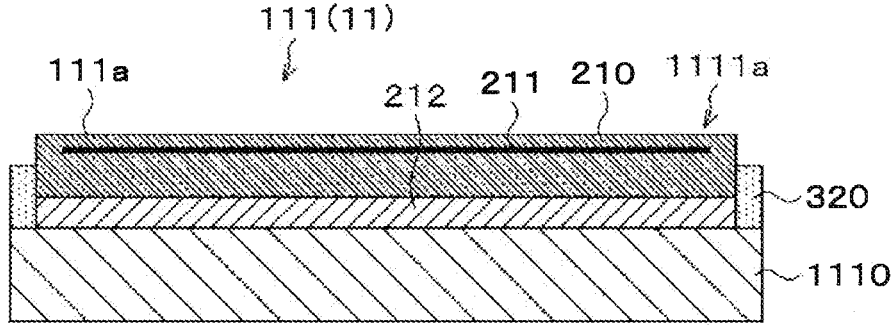
FIG. 11 is a cross-sectional view schematically illustrating a configuration of a body portion of a substrate support according to an eighth embodiment.

FIG. 11 is a cross-sectional view schematically illustrating a configuration of the body portion of the substrate support portion according to an eighth embodiment. The eighth embodiment is a modification of the seventh embodiment and protects the bonding layer in the first to sixth embodiments. In the following examples as well, the case of protecting the bonding layer 212 in the second embodiment is described, and in the example of FIG. 11, illustration of the second dielectric portion 1111*b* is omitted.

A diameter of the bonding layer 212 bonding the first dielectric portion 111*a* and the base 1110 is approximately the same as a diameter of the first dielectric portion 1111*a*. A sprayed ring 320 as a protection member is disposed on the outer periphery of the bonding layer 212 to cover the external surface of the corresponding bonding layer 212. An upper portion of the sprayed ring 320 may cover a lower external surface of the sintered layer 210. The sprayed ring 320 has an approximately annular shape. A thickness of the sprayed ring 320 in the radial direction is set in balance with heat generating ability, for example, several mm.

The sprayed ring 320 is formed by thermally spraying an insulating material, for example, ceramic, such as $Al_2O_3$. In the present embodiment, the sintered layer 210 is bonded to the base 1110 through the bonding layer 212, and then the sprayed ring 320 is formed by thermal spraying.

In the present embodiment as well, the same effects as those of the seventh embodiment may be achieved. That is, since the sprayed ring 320 is provided to cover the external surface of the bonding layer 212, consumption of the bonding layer 212 may be suppressed and heat generating ability may be improved. In addition, the sprayed ring 320 has the advantage of reducing manufacturing costs due to a short manufacturing period. In addition, the sprayed ring 320 does not detach from the bonding layer 212.

Ninth Embodiment

Figure 12:
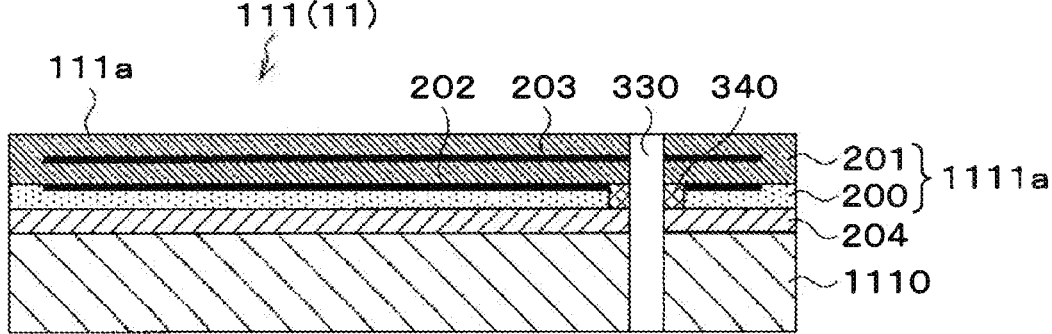
FIG. 12 is a cross-sectional view schematically illustrating a configuration of a body portion of a substrate support according to a ninth embodiment.

FIG. 12 is a cross-sectional view schematically illustrating a configuration of the body portion of the substrate support according to a ninth embodiment. In the present embodiment, an impregnated portion is provided at a desired position in the body portion 111 in the first to eighth embodiments described above. In the following example, a case in which an impregnated portion is provided in the first dielectric portion 1111*a* in the first embodiment is described. In addition, in the example of FIG. 12, illustration of the second dielectric portion 1111*b* is omitted.

A through-hole 330 is formed in the body portion 111. The through-hole 330 is provided to penetrate through the sintered layer 201 and the sprayed layer 200 of the first dielectric portion 1111*a*, the bonding layer 204, and the base 1110. The use of the through-hole 330 is arbitrary, but may be used as, for example, a passage through which heat transfer gas circulates, a path through which electric power is supplied to an electrode, a through-hole through which a lifting pin for loading the substrate W on the electrostatic chuck 1111 is inserted, etc.

Here, during processing of the substrate W, the plasma processing space 10*s* is maintained in a vacuum atmosphere, while the inside of the through-hole 330 is in an atmospheric atmosphere. In addition, since the sprayed layer 200 has a porous structure, there is a risk that air from the through-hole 330 may leak through the sprayed layer 200 into the plasma processing space 10*s* in a vacuum atmosphere.

Therefore, in the present embodiment, an impregnated portion 340 is formed around the through-hole 330 in the sprayed layer 200. The impregnated portion 340 is formed, for example, by impregnating the sprayed portion with a resin. In this case, since the surrounding of the through-hole 330 is sealed by the impregnated portion 340, leakage of air from the through-hole 330 described above may be suppressed.

Figures 13A, 13B, 13C, 13D, 13E:
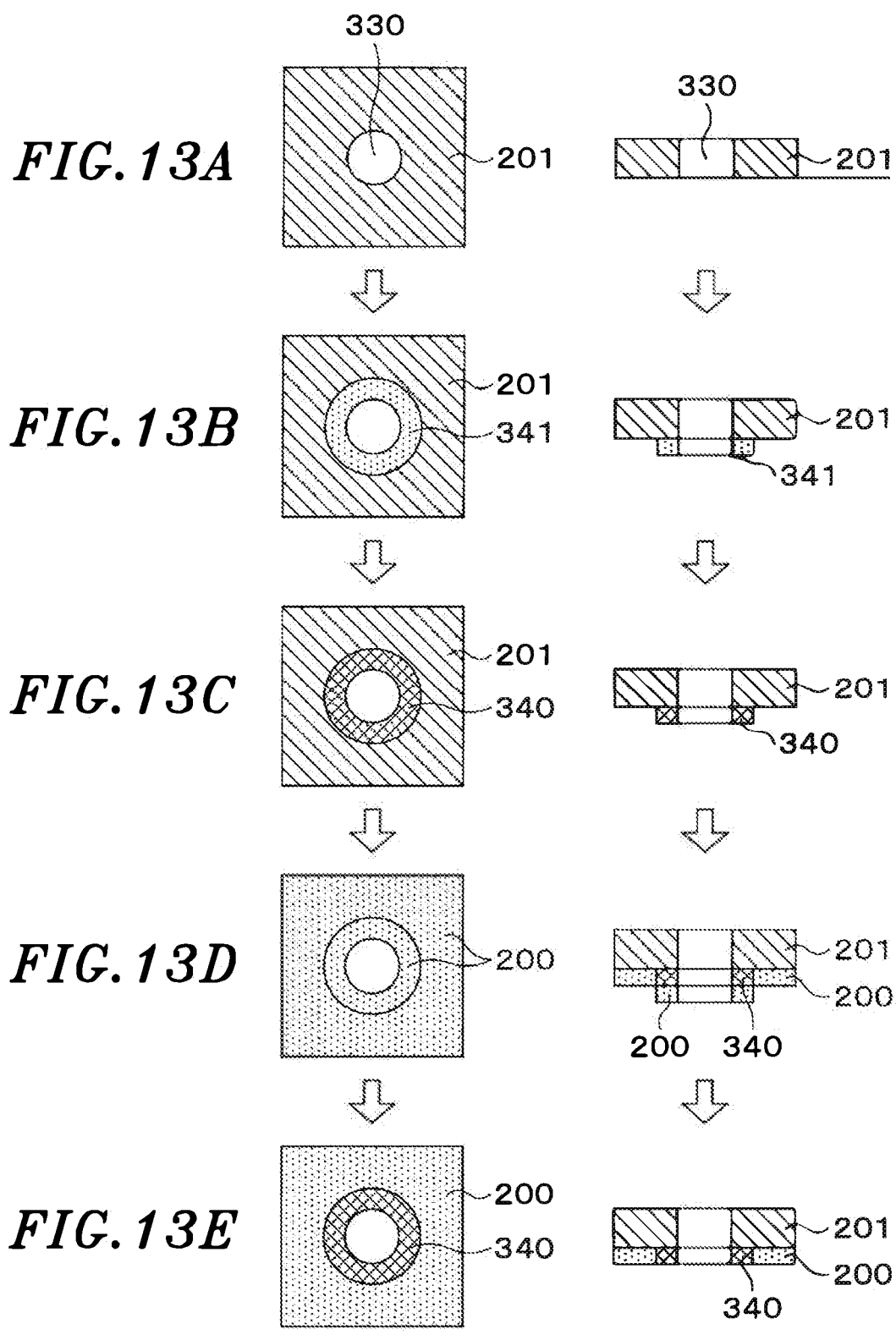
FIGS. 13A-E are explanatory diagrams illustrating a method of forming an impregnated portion in the ninth embodiment.

As described above, the impregnated portion 340 is formed by impregnating the sprayed portion around the through-hole 330 with a resin. In order to appropriately control the range of the impregnated portion 340, in the present embodiment, the impregnated portion 340 is formed using the following method. FIG. 13 is an explanatory diagram illustrating a method of forming the impregnated portion 340. In FIG. 13, the flow on the left is a plan view of the periphery of the through-hole 330 viewed from the bottom side, and the flow on the right is a cross-sectional view of the periphery of the through-hole 330.

First, as shown in (a) of FIG. 13, the sintered layer 201 in which the through-hole 330 is formed is prepared.

Next, as shown in (b) of FIG. 13, the sprayed portion 341 is formed in a desired region of the through-hole 330 on the lower surface of the sintered layer 201. The sprayed portion 341 is formed by thermally spraying an insulating material, for example, ceramic, such as $Al_2O_3$. In this manner, since the sprayed portion 341 is formed by thermal spraying, a formation range and formation thickness in a plan view may be appropriately controlled.

Next, as shown in (c) of FIG. 13, the sprayed portion 341 is impregnated with a resin to form the impregnated portion 340.

Next, as shown in (d) of FIG. 13, the sprayed layer 200 is formed on the entire lower surface of the sintered layer 201. The sprayed layer 200 is formed by thermally spraying an insulating material, for example, ceramic, such as $Al_2O_3$. At this time, the sprayed layer 200 is also formed on the lower surface of the impregnated portion 340.

Next, as shown in (e) of FIG. 13, the sprayed layer 200 adjacent to the lower surface of the impregnated portion 340 is ground to expose the corresponding impregnated portion 340. In this manner, the impregnated portion 340 is formed around the through-hole 330 in the sprayed layer 200.

In addition, in the present embodiment, the impregnated portion 340 is formed around the through-hole 330, but the formation position of the impregnated portion 340 is not limited thereto. The impregnated portion 340 of the present embodiment may be installed in a location where it is necessary to seal a vacuum atmosphere and an atmospheric atmosphere.

In addition, by providing the impregnated portion 340, it is possible to adjust thermal resistance or electrostatic capacitance in the sprayed layer 200. The impregnated portion 340 may be formed at a desired location for the purpose of adjusting thermal resistance or capacitance.

Embodiment 10

Figure 14:
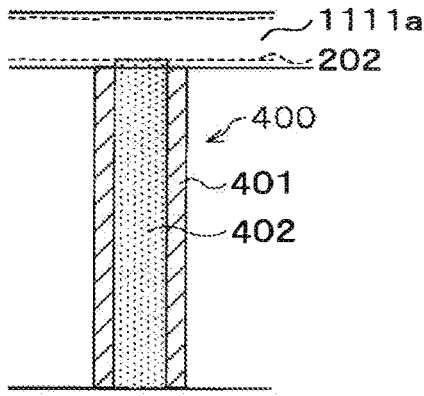
FIG. 14 is a cross-sectional view schematically illustrating a configuration of a power feed terminal according to a tenth embodiment.
Figure 15:
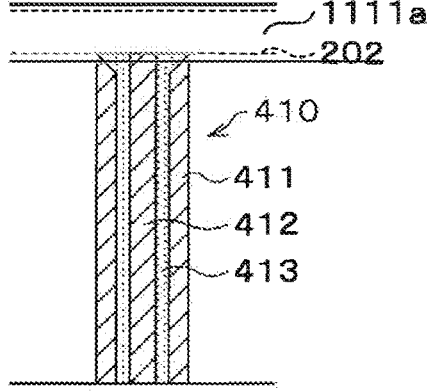
FIG. 15 is a cross-sectional view schematically illustrating a configuration of a power feed terminal according to the tenth embodiment.
Figure 16:
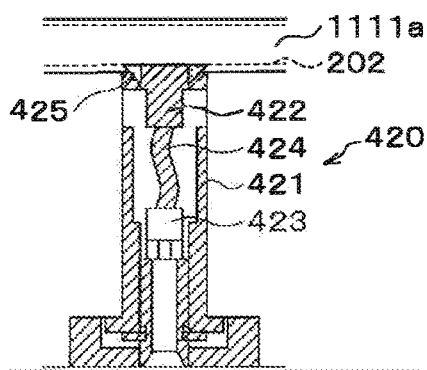
FIG. 16 is a cross-sectional view schematically illustrating a configuration of a power feed terminal according to the tenth embodiment.

FIGS. 14 to 16 are cross-sectional views schematically illustrating a configuration of a power feed terminal according to a tenth embodiment, respectively. The power feed terminal of the present embodiment is a power feed terminal for supplying power to each electrode in the first to ninth embodiments. In the following example, a power feed terminal that supplies power to the heater electrode 202 of the first embodiment is described.

The power feed terminal connected to the electrode installed on the electrostatic chuck needs to appropriately supply power to the corresponding electrode. In addition, since a difference in linear expansion coefficient occurs between the sintered layer or sprayed layer on which the electrode is installed and the base, the power feed terminal needs to absorb shear stress that occurs between the sintered layer or the sprayed layer and the base. Therefore, the power feed terminal of the present embodiment has a power feeding function and a shear stress absorption function.

The power feed terminal 400 shown in FIG. 14 is installed inside the first dielectric portion 1111a and connected to the heater electrode 202. The first dielectric portion 1111a is a sintered layer or a sprayed layer. The power feed terminal 400 includes a cylindrical portion 401 and a sprayed portion 402. The cylindrical portion 401 is formed of an insulating material. The sprayed portion 402 is buried inside the cylindrical portion 401 by thermally spraying a conductive material, for example, metal, such as aluminum, into the cylindrical portion 401. The sprayed portion 402 is connected to the heater electrode 202 and to a power feed line (not shown) that communicates with a power source (not shown).

In this case, power may be appropriately supplied to the heater electrode 202 by the sprayed portion 402. In addition, since the sprayed portion 402 has a porous structure, the sprayed portion 402 may absorb the aforementioned shear stress, thereby suppressing damage of the power feed terminal 400.

The power feed terminal 410 shown in FIG. 15 is installed inside the first dielectric portion 1111a and connected to the heater electrode 202. The first dielectric portion 1111a is a sintered layer or a sprayed layer. The power feed terminal 410 includes a cylindrical portion 411, a core portion 412, and a sprayed portion 413. The cylindrical portion 411 is formed of an insulating material. The core portion 412 is inserted through and disposed within the cylindrical portion 411 and is formed of an insulating material. The sprayed portion 413 is formed by thermally spraying a conductive material, for example, metal, such as aluminum, around the core portion 412 inside the cylindrical portion 401. The sprayed portion 413 is connected to the heater electrode 202 and to a power feed line (not shown) that communicates with a power source (not shown).

In this case, power may be appropriately supplied to the heater electrode 202 by the sprayed portion 413. In addition, since the sprayed portion 413 has a porous structure, the sprayed portion 413 may absorb the aforementioned shear stress, thereby suppressing damage to the power feed terminal 400. For example, as shown in FIG. 14, when it is difficult to manufacture the sprayed portion 402 inside the cylindrical portion 401, the sprayed portion 413 may be installed around the core portion 412 as in this example.

The power feed terminal 420 shown in FIG. 16 is installed inside the first dielectric portion 1111a and connected to the heater electrode 202. The first dielectric portion 1111a is a sintered layer or a sprayed layer. The power feed terminal 420 includes a cylindrical portion 421, conductor portions 422 and 423, a conductive wire portion 424, and a sprayed portion 425. The cylindrical portion 421 is formed of an insulating material. The conductor portion 422 is formed of a conductive material, for example, metal. The conductor portion 422 is located at an inner upper portion of the cylindrical portion 421 and is connected to the heater electrode 202. The conductor portion 423 is also formed of a conductive material, for example, metal. The conductor portion 423 is installed inside the cylindrical portion 421 and is connected to a power feed line (not shown) that communicates with a power source (not shown). The conductive wire portion 424 is formed of a conductive material and has, for example, a stranded wire structure in which a plurality of metal wires are bundled together. The conductive wire portion 424 is connected to the conductor portions 422 and 423. The sprayed portion 425 is formed by thermally spraying a conductive material, for example, metal, such as aluminum, around the conductor portion 422 in an inner upper portion of the cylindrical portion 421. The sprayed portion 425 is connected to the heater electrode 202.

In this case, since power is supplied to the heater electrode 202 through the sprayed portion 425 together with the conductor portion 422, the corresponding power may be supplied appropriately. In addition, the aforementioned shear stress is absorbed even by the sprayed portion 425 having a porous structure along with the conductor portion 422. As a result, damage to the power feed terminal 400 may be suppressed.

As described above, any of the power feed terminals 400, 410, and 420 may appropriately supply power to the heater electrode 202 and absorb shear stress. In addition, the sprayed portions 402, 413, and 425 to achieve these effects each have the advantage of having a short manufacturing period and reducing manufacturing cost.

Eleventh Embodiment

Figure 17:
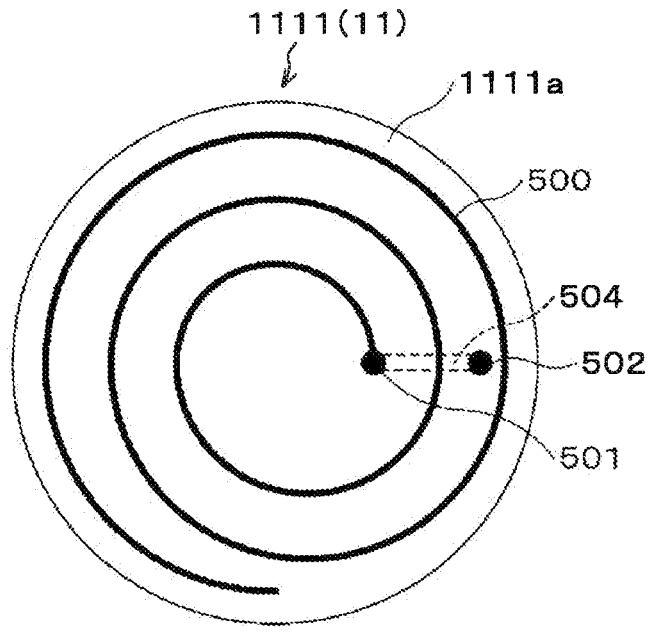
FIG. 17 is a plan view schematically illustrating a configuration of an electrostatic chuck of a substrate support according to an eleventh embodiment.
Figure 18:
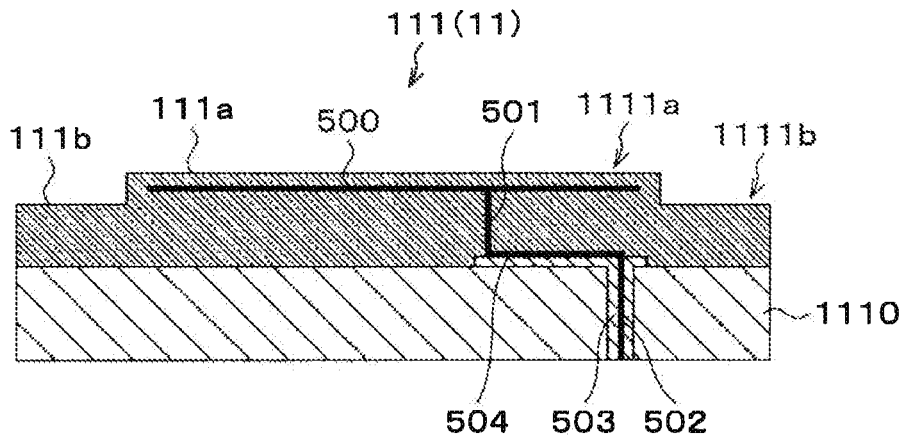
FIG. 18 is a cross-sectional view schematically illustrating a configuration of a body portion of a substrate support according to the eleventh embodiment.

FIG. 17 is a plan view schematically illustrating a configuration of an electrostatic chuck of a substrate support according to an eleventh embodiment. FIG. 18 is a cross-sectional view schematically illustrating a configuration of the body portion of the substrate support according to the eleventh embodiment. In the present embodiment, the power feed terminal to which each electrode is connected and the connection terminal provided on the base 1110 and communicating with the power feed terminal in the first to tenth embodiments are arranged to be offset in a plan view.

In the example of FIGS. 17 and 18, for ease of description, the structure of the first dielectric portion 1111a in the electrostatic chuck 1111 is not specified, and an example in which a heater electrode 500 is installed inside the first dielectric portion 1111a is described. A heater pattern of the heater electrode 500 is arbitrary, but has, for example, a vortex shape in a plan view.

A power feed terminal 501 for supplying power to the heater electrode 500 is connected to one end of the center side of the heater electrode 500. The power feed terminal 501 is provided inside the first dielectric portion 1111a. In addition, a connection terminal 502 exposed to an upper surface of the base 1110 is provided in the base 1110. The connection terminal 502 is located to be offset toward the outer periphery from the power feed terminal 501 in a plan view below the first dielectric portion 1111a. In addition, the connection terminal 502 is provided to be inserted into the insulator portion 503 and is electrically insulated from the base 1110.

A sprayed electrode 504 is installed at an interface between the first dielectric portion 111a and the base 1110 to connect a lower end of the power feed terminal 501 and an upper end of the connection terminal 502. The sprayed electrode 504 is formed by thermally spraying a conductive material, for example, metal.

Here, in the related art, the power feed terminal connected to the heater electrode 500 and the connection terminal installed in the base 1110 were arranged at the same position in a plan view. That is, the connection terminal was disposed immediately below the power feed terminal, and the corresponding power feed terminal and the connection terminal were connected. In this case, if a heater pattern of the heater electrode 500 was changed and a position of the power feed terminal was changed accordingly, it was necessary to prepare the base 1110 in which the position of the connection terminal changed accordingly. Due to this, the manufacturing period for the electrostatic chuck 1111 was lengthened, and the manufacturing cost also increased.

In this regard, according to the present embodiment, even if the heater pattern of the heater electrode 500 is changed and the position of the power feed terminal 501 is changed, there is no need to newly manufacture the base 1110. Therefore, the base 1110 may be common for a plurality of electrostatic chucks 1111, while corresponding to a certain heater pattern of the heater electrode 500. In addition, the sprayed electrode 504 has the advantage of having a short manufacturing period and reducing the manufacturing cost. As a result, the manufacturing period for the entire substrate support portion 11 may be shortened to reduce the manufacturing cost.

In addition, since the first dielectric portion 111a and the base 1110 are formed of different materials, thereby causing a difference in linear expansion coefficient, and thus, shear stress may occur at the interface between the first dielectric portion 111a and the base 1110, making the interface vulnerable. In this regard, since the sprayed electrode 504 has a porous structure, the sprayed electrode 504 may absorb shear stress, thereby improving the vulnerability of the interface.

In addition, the sprayed electrode 504 of the present embodiment may be applied to any structure of the first dielectric portion 1111a as described above. For example, the first dielectric portion 1111a may include a sprayed layer and a sintered layer as in the first embodiment or may include only a sintered layer as in the second embodiment.

In addition, in the present embodiment, the electrode to which power is supplied is the heater electrode 500, but the present disclosure is not limited thereto. For example, the sprayed electrode of the present embodiment may be applied even when supplying power to an electrostatic electrode or a bias electrode.

Embodiment 12

Figure 19:
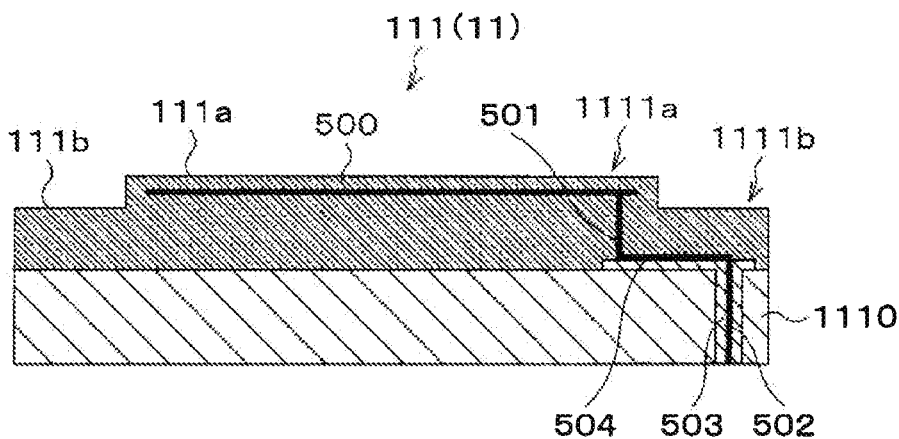
FIG. 19 is a cross-sectional view schematically illustrating a configuration of a body portion of a substrate support according to a twelfth embodiment.

FIG. 19 is a cross-sectional view schematically illustrating a configuration of the body portion of the substrate support portion according to a twelfth embodiment. The twelfth embodiment is a modification of the eleventh embodiment.

In the present embodiment, similar to the eleventh embodiment, the power feed terminal 501 connected to the heater electrode 500 and the connection terminal 502 provided on the base 1110 are arranged to be offset in a plan view. Meanwhile, the connection terminal 502 of the present embodiment is disposed to be closer to the outer periphery side than the connection terminal 502 of the eleventh embodiment, and is disposed outside the first dielectric portion 1111a in the radial direction. That is, the connection terminal 502 is disposed below the second dielectric portion 1111b.

Here, the connection terminal 502 may become singularity when adjusting the temperature of the substrate W. In this regard, in the present embodiment, since the connection terminal 502 is disposed on the outer side of the substrate W supported by the first dielectric portion 1111a in the radial direction, the singularity may be eliminated, and uniformity within the substrate surface of the plasma processing may be improved.

Also, in the present embodiment, the same effects as those in the eleventh embodiment may be achieved. That is, the base 1110 may be made common in response to a certain heater pattern and the manufacturing cost may be reduced by shortening the manufacturing period for the substrate support portion 11.

Embodiment 13

Figure 20:
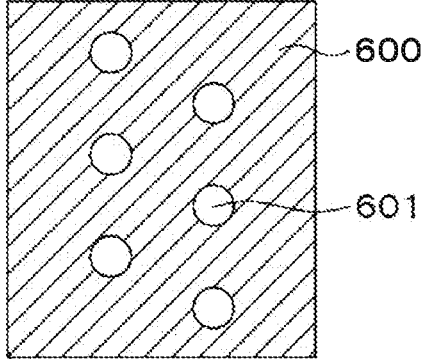
FIG. 20 is a plan view schematically illustrating a configuration of a heater electrode according to a thirteenth embodiment.

FIG. 20 is a plan view schematically illustrating a configuration of a heater electrode according to a thirteenth embodiment. In the present embodiment, a pinhole is formed in the heater electrode in the above embodiment.

The heater electrode 600, which is provided inside the first dielectric portion 1111*a* and is used to adjust the temperature of the substrate W, is formed by thermally spraying a conductive material, for example, metal, like the heater electrode 202 of the first embodiment. The heater electrode 600 corresponds to a sprayed heater electrode in the present disclosure. In the heater electrode 600, trimming is performed at a desired position, and a plurality of pinholes 601 as through-holes are formed.

Here, as recent product generations progress, demand for suppressing individual differences in electrostatic chucks has increased. In addition, it is necessary to correct variations in film thickness of the heater electrode inside the electrostatic chuck. In the related art, in order to obtain the required amount of heat generated by the heater electrode, the heater electrode is formed to have a certain width, and then, for example, the outside of the heater electrode is cut out, and the width of the heater electrode is adjusted to adjust a resistance value of the heater electrode. However, there are cases in which it is not possible to appropriately control the temperature at a certain position of the substrate only by adjusting the width of the heater electrode.

In this regard, in the present embodiment, the plurality of pinholes 601 are formed at desired positions of the heater electrode 600. By adjusting the number and arrangement of the pinholes 601, the resistance value of the desired position of the heater electrode 600 may be adjusted. In other words, precise temperature control is possible by forming the pinholes 601 to be dispersed in a desired portion. Therefore, by adjusting the substrate W to an appropriate temperature, uniformity within the substrate surface of the plasma processing may be improved.

In addition, since the resistance value of the heater electrode 600 is adjusted by the pinhole 601 rather than the width of the heater electrode as in the related art, the degree of freedom in designing the heater electrode 600 is improved.

In the present embodiment, when manufacturing the first dielectric portion 1111*a*, the heater electrode 600 is first formed by thermal spraying. Thereafter, the resistance value is measured in a certain section of the heater electrode 600, and a deviation of the heater electrode 600 necessary to ensure in-plane uniformity of the temperature distribution of the substrate W is checked in advance. Thereafter, based on the check result of the deviation, a required resistance increase value is calculated, and the number and arrangement of the pinholes 601 to be trimmed in the heater electrode 600 are determined. Then, the heater electrode 600 is trimmed based on the result of determining the number and arrangement to form the pinholes 601.

In addition, in the example of FIG. 20, the pinhole 601 has a circular shape in a plan view, but the planar shape is not limited thereto. For example, the pinhole 601 may have a triangular or quadrangular shape. However, the manufacturing of the heater electrode 600 becomes easier by using a simple shape.

The embodiment disclosed here should be considered in all respects as an example and not restrictive. The above embodiments may be omitted, substituted, or changed in various forms without departing from the appended claims and the general spirit thereof.

For example, the body portion 111 of the substrate support portion 11 may be formed by combining any two or more of the first to thirteenth embodiments.

The invention claimed is:

1. A substrate support comprising:
a base;
a first dielectric portion disposed on the base and having a substrate support portion on which a substrate is mounted; and
a second dielectric portion disposed around the first dielectric portion, disposed on the base and having an edge ring support portion on which an edge ring is mounted,
wherein the edge ring support portion is a sprayed layer formed of an insulating material,
the first dielectric portion includes:
a sintered layer for supporting the substrate; and
a first electrostatic electrode inside the sintered layer,
the second dielectric portion includes a second electrostatic electrode inside the sprayed layer of the edge ring support portion to adsorb the edge ring, and
the sprayed layer of the second dielectric portion is disposed directly on the base.

2. The substrate support of claim 1, wherein the substrate support includes a bonding layer bonding the base to the sintered layer of the first dielectric portion.

3. The substrate support of claim 1, wherein the sprayed layer of the second dielectric portion is disposed to elongate to a lower portion of the first dielectric portion, and
the substrate support includes a bonding layer bonding the sintered layer of the first dielectric portion and the sprayed layer of the second dielectric portion.

4. The substrate support of claim 1, wherein the first dielectric portion includes a first sprayed layer formed of an insulating material and the sintered layer disposed on the first sprayed layer and formed of an insulating material,
the sprayed layer of the second dielectric portion is a second sprayed layer and is disposed to elongate to a lower portion of the first dielectric portion, and
the substrate support includes a bonding layer bonding the sprayed layer of the first dielectric portion and the second sprayed layer of the second dielectric portion.

5. The substrate support of claim 1, wherein the first dielectric portion includes a first sprayed layer formed of an insulating material and a first sintered layer disposed on the first sprayed layer and formed of an insulating material, and
the sprayed layer of the second dielectric portion is a second sprayed layer and the second dielectric portion further includes a sintered layer disposed on the second sprayed layer and formed of an insulating material.

6. The substrate support of claim 5, wherein the first sprayed layer of the first dielectric portion includes a plurality of stacked sprayed layers, and
the second sprayed layer of the second dielectric portion includes a plurality of stacked sprayed layers.

7. The substrate support of claim 5, wherein the first dielectric portion further includes:
the first bias electrode supplied with bias power.

8. The substrate support of claim 7, wherein the second dielectric portion further includes:
a second bias electrode supplied with bias power.

9. The substrate support of claim 5, wherein the first dielectric portion further includes:
a first heater electrode adjusting a temperature of the substrate.

10. The substrate support of claim 9, wherein the second dielectric portion further includes a second heater electrode adjusting a temperature of the edge ring.

11. The substrate support of claim 8, wherein the first bias electrode and the second bias electrode are disposed to overlap each other in a plan view.

12. The substrate support of claim 5, wherein the first dielectric portion and the base below the first dielectric portion are arranged to be apart from the second dielectric portion and the base below the second dielectric portion.

13. The substrate support of claim 5, further comprising:
a first bonding layer bonding the base to the first sprayed layer of the first dielectric portion; and
a second bonding layer bonding the base to the second sprayed layer of the second dielectric portion.

14. The substrate support of claim 1, further comprising:
a bonding layer bonding the base to the first dielectric portion; and
a sprayed ring disposed to cover an external surface of the bonding layer and formed of an insulating material.

15. The substrate support of claim 1, wherein the first dielectric portion includes a sprayed heater electrode for controlling a temperature of the substrate, and
a through-hole is formed at a desired position in the sprayed heater electrode.

16. A substrate processing apparatus comprising:
a plasma processing chamber; and
substrate support installed inside the plasma processing chamber,
wherein the substrate support includes:
a base;
a first dielectric portion disposed on the base and having a substrate support portion on which a substrate is mounted; and
a second dielectric portion disposed around the first dielectric portion, disposed on the base and having an edge ring support portion on which an edge ring is mounted,
wherein the edge ring support portion is a sprayed layer formed of an insulating material,
the first dielectric portion includes:
a sintered layer for supporting the substrate; and
a first electrostatic electrode inside the sintered layer,
the second dielectric portion includes a second electrostatic electrode inside the sprayed layer of the edge ring support portion to adsorb the edge ring, and
the sprayed layer of the second dielectric portion is disposed directly on the base.

17. The substrate processing apparatus of claim 16, wherein the first dielectric portion includes a first sprayed layer, and
the substrate processing apparatus further comprises a bonding layer bonding the base to the first sprayed layer of the first dielectric portion.

18. The substrate processing apparatus of claim 16, wherein
the substrate support includes a bonding layer bonding the base to the sintered layer of the first dielectric portion.

19. The substrate processing apparatus of claim 16, wherein
the sprayed layer of the second dielectric portion is disposed to elongate to a lower portion of the first dielectric portion, and
the substrate support includes a bonding layer bonding the sintered layer of the first dielectric portion and the sprayed layer of the second dielectric portion.

20. The substrate processing apparatus of claim 16, wherein the first dielectric portion further includes a first sprayed layer formed of an insulating material, the sintered layer being disposed on the first sprayed layer and formed of an insulating material,
the sprayed layer of the second dielectric layer is a second sprayed layer,
the second sprayed layer of the second dielectric portion is disposed to elongate to a lower portion of the first dielectric portion, and
the substrate support includes a bonding layer bonding the sprayed layer of the first dielectric portion and the second sprayed layer of the second dielectric portion.

21. The substrate processing apparatus of claim 16, wherein the first dielectric portion further includes a first sprayed layer formed of an insulating material and the first sintered layer disposed on the first sprayed layer and formed of an insulating material, and
the sprayed layer of the second dielectric portion is a second sprayed layer and the second dielectric portion further includes a second sintered layer disposed on the second sprayed layer and formed of an insulating material.

22. The substrate processing apparatus of claim 21, wherein the first sprayed layer of the first dielectric portion includes a plurality of stacked sprayed layers, and
the second sprayed layer of the second dielectric portion includes a plurality of stacked sprayed layers.

23. The substrate processing apparatus of claim 21, wherein the first dielectric portion and the base below the first dielectric portion are arranged to be apart from the second dielectric portion and the base below the second dielectric portion.

24. The substrate processing apparatus of claim 21, wherein a first bonding layer bonding the base to the first sprayed layer of the first dielectric portion, and
a second bonding layer bonding the base to the second sprayed layer of the second dielectric portion.

* * * * *